United States Patent
Endo et al.

(10) Patent No.: US 11,362,608 B2
(45) Date of Patent: Jun. 14, 2022

(54) MOTOR CONTROL SYSTEM AND POWER STEERING SYSTEM

(71) Applicant: NIDEC CORPORATION, Kyoto (JP)

(72) Inventors: Shuji Endo, Kyoto (JP); Akitoshi Harada, Kyoto (JP); Tomoya Ueda, Kyoto (JP); Masanori Watahiki, Kyoto (JP); Tomonari Mori, Kyoto (JP); Tokuji Tatewaki, Kanagawa (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 16/970,952

(22) PCT Filed: Feb. 8, 2019

(86) PCT No.: PCT/JP2019/004543
§ 371 (c)(1),
(2) Date: Aug. 19, 2020

(87) PCT Pub. No.: WO2019/163554
PCT Pub. Date: Aug. 29, 2019

(65) Prior Publication Data
US 2020/0395877 A1    Dec. 17, 2020

(30) Foreign Application Priority Data

Feb. 20, 2018  (JP) .............................. JP2018-028068
Mar. 30, 2018  (JP) .............................. JP2018-068925
Oct. 19, 2018  (JP) .............................. JP2018-197969

(51) Int. Cl.
*H02P 21/00* (2016.01)
*H02P 21/05* (2006.01)
(Continued)

(52) U.S. Cl.
CPC .............. *H02P 21/05* (2013.01); *B62D 5/046* (2013.01); *B62D 5/0409* (2013.01);
(Continued)

(58) Field of Classification Search
CPC .......... H02P 21/05; H02P 21/22; H02P 27/12; B62D 5/0409; B62D 5/046; G01R 31/43
See application file for complete search history.

(56) References Cited

U.S. PATENT DOCUMENTS

2013/0099707 A1   4/2013   Okubo
2015/0333670 A1   11/2015  Nakajima et al.

FOREIGN PATENT DOCUMENTS

| CN | 111212778 A | * | 5/2020 | ............. B62D 6/002 |
| JP | 200464909 A | | 2/2004 | |

(Continued)

OTHER PUBLICATIONS

International Search Report in PCT/JP2019/004543, dated May 14, 2019, 5pp.

*Primary Examiner* — Karen Masih
(74) *Attorney, Agent, or Firm* — Hauptman Ham, LLP

(57) ABSTRACT

One aspect of a noise compensation adjustment method includes: a measurement step of driving a motor to measure noise with respect to a coupled system including the motor and a driving body coupled to the motor and driven by the motor; an order identification step of, based on noise measured in the measurement step, identifying an order B of a component contributing to compensation of the noise from a k-th component and a 1/k-th component (k is an integer) in the rotation of the motor; an adjustment step of controlling driving of the motor using a component of the order B identified in the order identification step as a compensation value, and adjusting a component value of the order B to reduce the noise; and a recording step of recording the component value of the order B adjusted in the adjustment step as a compensation value for reducing the noise.

19 Claims, 20 Drawing Sheets

(51) Int. Cl.
*H02P 21/22* (2016.01)
*B62D 5/04* (2006.01)
*G01R 31/34* (2020.01)
*H02P 27/12* (2006.01)

(52) U.S. Cl.
CPC ............ *G01R 31/343* (2013.01); *H02P 21/22* (2016.02); *H02P 27/12* (2013.01)

(56) References Cited

FOREIGN PATENT DOCUMENTS

| | | | |
|---|---|---|---|
| JP | 2004328814 | A | 11/2004 |
| JP | 2006262668 | A | 9/2006 |
| JP | 2009207236 | A | 9/2009 |
| JP | 2012215412 | A | 11/2012 |
| JP | 201385430 | A | 5/2013 |
| JP | 201533265 | A | 2/2015 |
| JP | 201635676 | A | 3/2016 |
| JP | 201688106 | A | 5/2016 |
| JP | 201717912 | A | 1/2017 |

* cited by examiner

T1

| GAIN | TARGET CURRENT VALUE → | | | | | | | | | |
|---|---|---|---|---|---|---|---|---|---|---|
| MOTOR ROTATION SPEED ↓ | $A_{11}$ | $A_{12}$ | $A_{13}$ | | | ⋯⋯ | | | | $A_{1n}$ |
| | $A_{21}$ | | | | | | | | | |
| | $A_{31}$ | | | | | | | | | |
| | | | | | | | | | | |
| | ⋮ | | | | | ⋮ | | | | ⋮ |
| | | | | | | | | | | |
| | | | | | | | | | | |
| | $A_{m1}$ | | | | | ⋯⋯ | | | | $A_{mn}$ |

| PHASE | TARGET CURRENT VALUE → | | | | | | | | | |
|---|---|---|---|---|---|---|---|---|---|---|
| MOTOR ROTATION SPEED ↓ | $C_{11}$ | $C_{12}$ | $C_{13}$ | | | ⋯⋯ | | | | $C_{1n}$ |
| | $C_{21}$ | | | | | | | | | |
| | $C_{31}$ | | | | | | | | | |
| | | | | | | | | | | |
| | ⋮ | | | | | ⋮ | | | | ⋮ |
| | | | | | | | | | | |
| | | | | | | | | | | |
| | $C_{m1}$ | | | | | ⋯⋯ | | | | $C_{mn}$ |

MOTOR CONTROL SYSTEM AND POWER STEERING SYSTEM

CROSS-REFERENCE TO RELATED APPLICATIONS

This is the U.S. national stage of application No. PCT/JP2019/004543, filed on Feb. 8, 2019, and priority under 35 U.S.C. § 119(a) and 35 U.S.C. § 365(b) is claimed from Japanese Application No. 2018-028068, filed on Feb. 20, 2018, Japanese Application No. 2018-068925, filed on Mar. 30, 2018, and Japanese Application No. 2018-197969, filed on Oct. 19, 2018.

FIELD OF THE INVENTION

The present disclosure relates to a motor control system and a power steering system.

BACKGROUND

Conventionally, as a motor control technique, a method in which a control device feedback-controls a motor using a command value is known. For example, a configuration is known in which a control device feeds back a current command value having a phase opposite to the torque ripple and adds the current command value to a basic command value. In such a configuration, a method is known in which the control device superimposes a current command value of a harmonic component of the current value on the basic command value to compensate the torque ripple.

However, even if the operating noise is reduced in the motor alone, when the motor is coupled with another element such as a steering mechanism, noise may occur due to factors such as resonance.

SUMMARY

One aspect of a noise compensation adjustment method according to the present invention includes: a measurement step of driving a motor to measure noise with respect to a coupled system including the motor and a driving body coupled to the motor and driven by the motor; an order identification step of, based on noise measured in the measurement step, identifying an order B of a component contributing to compensation of the noise from a k-th component and a 1/k-th component (k is an integer) in the rotation of the motor; an adjustment step of controlling driving of the motor using a component of the order B identified in the order identification step as a compensation value, and adjusting a component value of the order B to reduce the noise; and a recording step of recording the component value of the order B adjusted in the adjustment step as a compensation value for reducing the noise.

One aspect of a manufacturing method of a motor control system according to the present invention is a manufacturing method of manufacturing a motor control system for controlling driving of a motor, the method including recording the compensation value in a storage unit in the motor control system by the noise compensation adjustment method.

The above and other elements, features, steps, characteristics and advantages of the present disclosure will become more apparent from the following detailed description of the preferred embodiments with reference to the attached drawings.

BRIEF DESCRIPTION OF THE DRAWINGS

FIG. 15 is a diagram showing a lookup table stored in a storage unit;

DETAILED DESCRIPTION

Hereinafter, embodiments of a controller of the present disclosure, a motor control system including the controller, and an electric power steering system including the motor control system will be described in detail with reference to the accompanying drawings. Note, however, that in order to avoid the following description from being unnecessarily redundant and to facilitate understanding of those skilled in the art, a detailed description more than necessary may be omitted in some cases. For example, detailed descriptions of well-known matters and duplicate description of substantially the same configuration may be omitted.

First Embodiment

A motor control system according to a first embodiment will be described in which a torque ripple compensation calculation unit for compensating a torque ripple is provided as a compensation calculation unit, and the output of the torque ripple compensation calculation unit is a "current value". A motor control system of the first embodiment is a control system that controls a three-phase brushless motor, for example. Hereinafter, for convenience, a case where a d-axis current Id and a q-axis current Iq are both positive, that is, a case where the rotation is in one direction will be described. The motor control system of the present embodiment is mainly capable of reducing torque ripple.

Generally, the q-axis current Iq has a larger influence on the torque generation in the three-phase motor than the d-axis current Id. For this reason, in order to reduce the torque ripple, it is preferable to mainly control the q-axis current Iq and apply this control system. Note that even in the case of a control system that reduces an induced voltage (BEMF: back electromotive force), feedback control can be performed with a similar configuration as the present invention. That is, in the control method of the present invention, it is possible to either use only the q-axis current as a command value, or use both the q-axis current Iq and the d-axis current Id as command values. Note that in this description, the explanation of the control method regarding the d-axis current Id is omitted.

Figure 1:
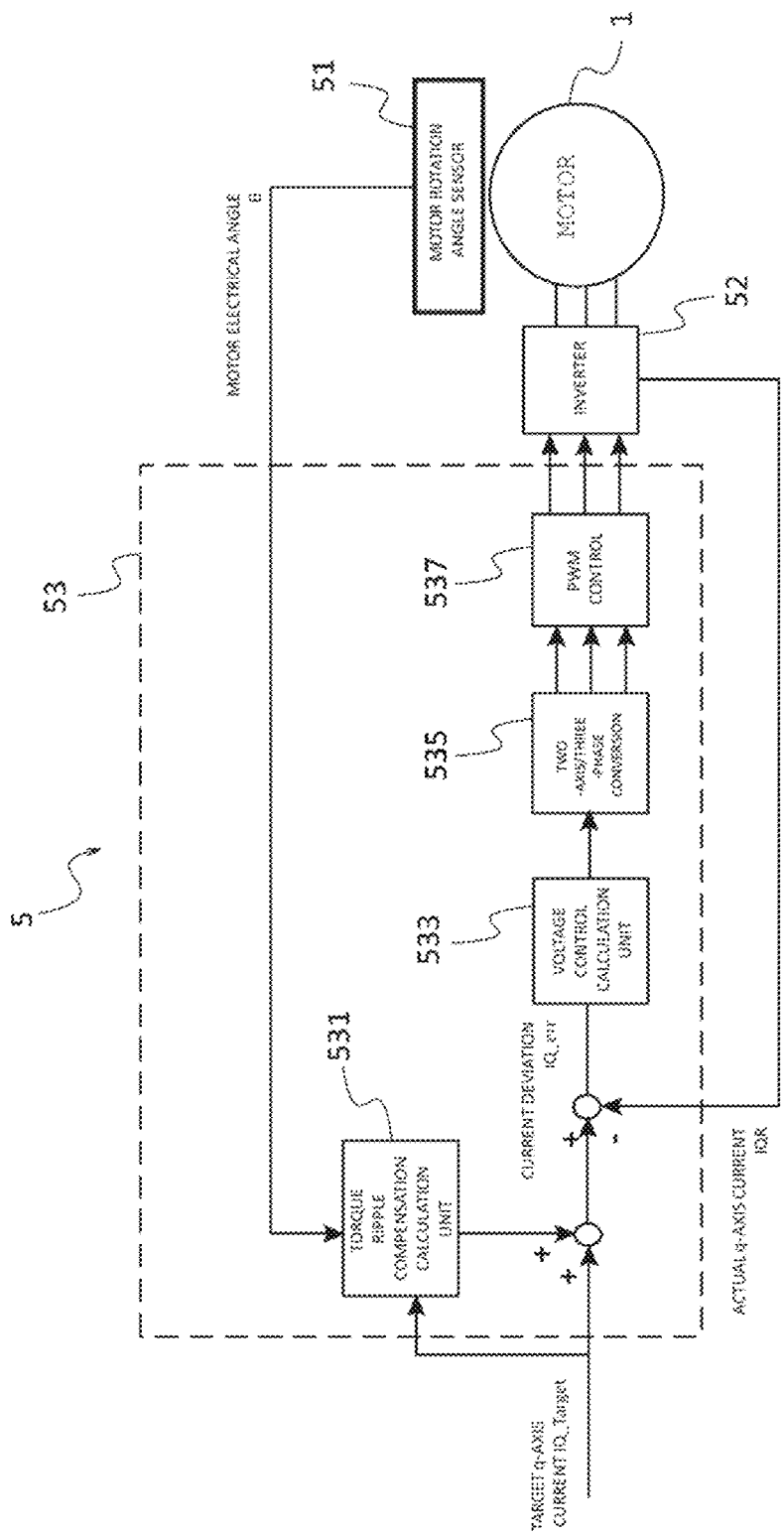
FIG. 1 is a schematic diagram of a motor control system of a first embodiment.
Figure 2:
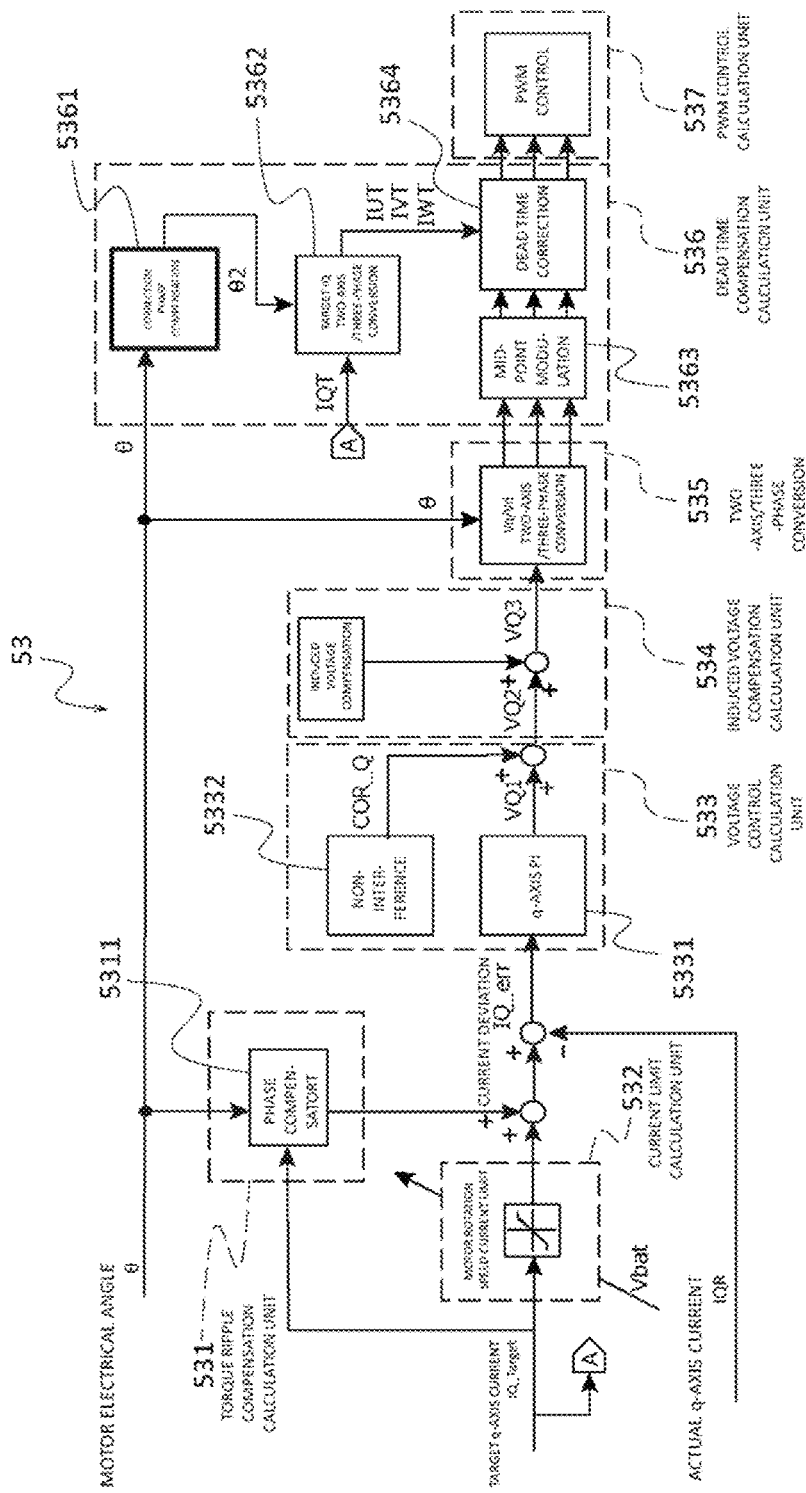
FIG. 2 is a schematic diagram of a control calculation unit of the first embodiment.

FIG. 1 is a schematic diagram of a motor control system of the first embodiment, and FIG. 2 is a schematic diagram of a control calculation unit of the first embodiment. As shown in FIG. 1, a motor control system 5 includes a motor rotation angle sensor 51, an inverter 52, and a control calculation unit 53. The control calculation unit 53 functions as a so-called current controller. As shown in FIG. 2, the control calculation unit 53 includes a torque ripple compensation calculation unit 531, a current limit calculation unit 532, a voltage control calculation unit 533, an induced voltage compensation calculation unit 534, a two-axis/three-phase conversion unit 535, a dead time compensation calculation unit 536, and a PWM control calculation unit 537.

The motor control system 5 controls a motor 1 through the inverter 52. The motor 1 has a rotor 3, a stator 2, and a motor rotation angle sensor 51. The motor rotation angle sensor 51 detects the rotation angle of the rotor 3 of the motor 1. The detected rotation angle of the rotor is represented by an arbitrary angle unit, and is appropriately converted from a mechanical angle to a motor electrical angle θ or from a motor electrical angle θ to a mechanical angle. The relationship between the mechanical angle and the motor electrical angle θ is expressed by the following relational expression: motor electrical angle θ=mechanical angle× (number of magnetic poles/2). Note that as a sensor for detecting the rotation of the motor, an angular velocity sensor may be provided instead of the rotation angle sensor.

The motor control system 5 of the present embodiment performs control to feed back the current value (actual q-axis current value IQR) flowing in the inverter 52. Additionally, although not shown, the motor control system 5 can further perform known arithmetic processing such as field weakening control. The motor control system 5 can suppress torque fluctuation in the motor 1 by performing field weakening control.

A target q-axis current Iq_target is input to the motor control system 5 from the outside. An increase or decrease in the motor output is instructed from the outside by increasing or decreasing the target q-axis current Iq_target. The motor control system 5 performs current limiting on the input target q-axis current Iq_target. The current limiting is processed by the current limit calculation unit 532. The current limit calculation unit 532 receives the target q-axis current Iq_target and performs adaptive control to limit the target q-axis current Iq_target (output value) to a predetermined current value or less.

When the target q-axis current Iq_target is not limited and exceeds the predetermined current value, the motor applied voltage may be saturated as a result of processing described later. When the motor applied voltage is saturated in this way, there is no room for adding a compensation current that suppresses motor torque fluctuation to the target q-axis current Iq_target. As a result, there is a problem that the torque ripple sharply increases and operating noise is generated. In order to avoid this problem, it is effective to leave room for the compensation current by limiting the target q-axis current Iq_target by the current limit calculation unit 532. The saturation of the motor applied voltage occurs depending on both the motor current and the motor rotation angular velocity. For this reason, the current limit calculation unit 532 of the present embodiment limits the motor current (target q-axis current Iq_target) using a function having the motor rotation angular velocity as a parameter. By performing such current limiting, room for compensation for the torque ripple is ensured at all times (when voltage is not saturated). For this reason, quiet and smooth rotation of the motor is achieved.

More specifically, the adaptive control by the current limit calculation unit 532 reduces the range with a function having the motor rotation angular velocity as a parameter. This function is a continuous function with respect to the input target q-axis current Iq_target. That is, the current limit calculation unit 532 does not perform a discontinuous limit such as cutting the peak value of the current, but performs a continuous range reduction of limiting the current more largely for a larger input current value. Note that the function used for the range reduction in the current limit calculation unit 532 may either be a function representing a linear reduction or a function representing a nonlinear (and continuous) reduction. The reduction width of the range reduction is the reduction width for reducing a current value i so that the following inequality is satisfied.

$$V\text{sat} > (Ls+R)i + ke\omega \qquad (1)$$

Here, Vsat is the saturation voltage, Ls is the inductance of the motor, R is the resistance of the motor, and keω is the induced voltage accompanying the rotation of the motor.

Additionally, in the adaptive control by the current limit calculation unit 532, when driven by a battery power supply, the current limit value due to the range reduction is a limit value according to a battery voltage Vbat. The battery power supply is used when the supply amount by an alternator becomes insufficient. Since the battery power supply has an internal resistance, the internal resistance changes due to deterioration of the battery power supply and the effective output voltage changes. For this reason, adaptive control is performed according to the battery voltage Vbat.

The motor control system 5 uses the target q-axis current Iq_target and an angular velocity co of the rotor to perform torque ripple compensation control. The torque ripple compensation control is processed by the torque ripple compensation calculation unit 531. The torque ripple compensation calculation unit 531 performs arithmetic processing using the target q-axis current Iq_target before correction and the angular velocity co as parameters. The angular velocity co is calculated on the basis of the rotation angle of the rotor 3 detected by the motor rotation angle sensor 51. More specifically, the torque ripple compensation calculation unit 531 includes a phase compensator 5311. Additionally, the phase compensator 5311 performs the torque ripple compensation control. Note that in the present embodiment, the functions of the torque ripple compensation calculation unit 531 and the phase compensator 5311 are the same.

Generally, torque ripple is affected by ripple in the current. For this reason, by performing correction such as superimposing the current command value (compensation current) for suppressing the torque ripple in advance on the target q-axis current Iq_target indicating the current given to the motor 1, it is possible to suppress the torque ripple generated in the motor 1 (i.e., to perform torque ripple compensation).

The torque ripple compensation calculation unit 531 in the present embodiment has a so-called lookup table. The lookup table refers to the angular velocity ω and the target q-axis current Iq_target as inputs, and outputs a gain α and a phase β as reference values corresponding to the inputs. In addition, the torque ripple compensation calculation unit 531 calculates α sin 6(θ+β) shown in expressions (2) and (3) described below, using the output reference values of gain α and phase β as parameters. This calculation result is superimposed on the target q-axis current Iq_target output from the current limit calculation unit 532 as shown in FIG. 2 and expression (2) described below, to calculate a corrected target q-axis current Iq_correct which is a new current command value.

Figure 3:
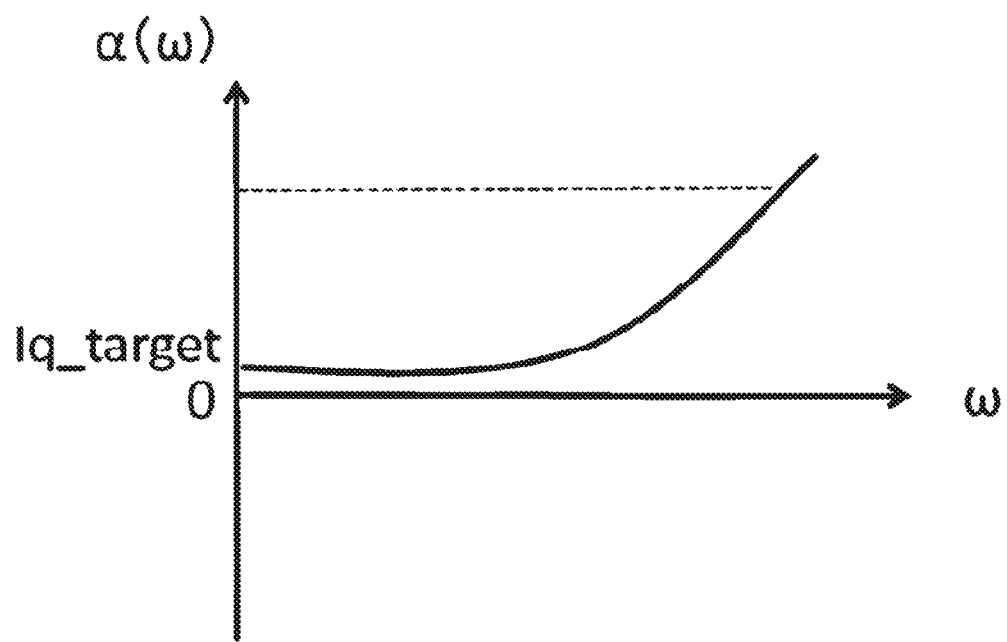
FIG. 3 is a gain characteristic diagram for a target q-axis current Iq_target.
Figure 4:
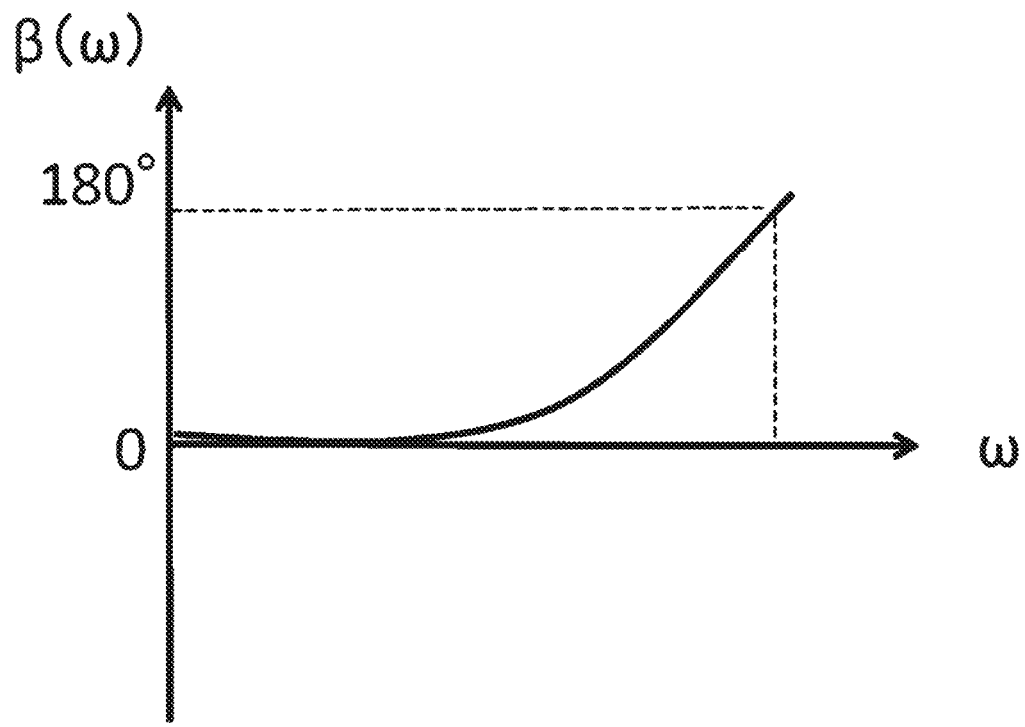
FIG. 4 is a phase curve diagram for the target q-axis current Iq_target.

Next, the mutual correlation of the angular velocity ω, the target q-axis current Iq_target, the gain α, and the phase β will be described. FIG. 3 is a gain characteristic diagram for the target q-axis current Iq_target. FIG. 4 is a phase curve diagram for the target q-axis current. The gain characteristic diagram of FIG. 3 and the phase curve diagram of FIG. 4 each show a first-order lag characteristic. Note, however, that the gain α and the phase β may be obtained by a characteristic in which a second-order or more response lag is taken into consideration.

The phase curve diagram in FIG. 4 is obtained by performing normalization with the target q-axis current Iq_target set as the initial value. In FIG. 3, the horizontal axis represents the angular velocity ω and the vertical axis represents the value of the gain α (ω). In FIG. 4, the horizontal axis represents the angular velocity ω and the vertical axis represents the phase β (ω). Here, the current (compensation value) for compensating the torque ripple is α sine wave, and is represented by approximation using the sixth harmonic component that is dominant in the vibration component of the torque ripple. At this time, the corrected target q-axis current value Iq_correct is expressed by following expression (2) using the target q-axis current Iqt_target before correction and the motor electrical angle θ(θ=ωt) as variables. Note that t is a variable that represents time.

$$Iq\_correct = Iq\_target + \alpha \sin 6(\theta+\beta) \quad (2)$$

Figure 5:
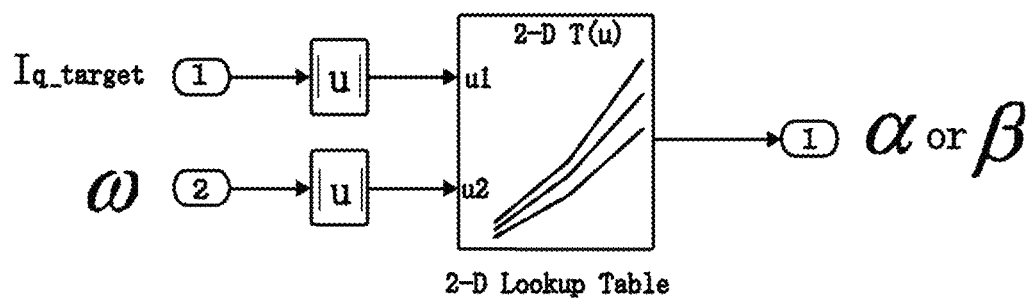
FIG. 5 is a schematic diagram showing a flow of arithmetic processing by a 2D map.

Additionally, the gain α(ω) and the phase β(ω) are represented by the following arithmetic expression (3) using a lookup table. At this time, the gain α(ω) and the phase β(ω) are calculated by performing arithmetic processing using a 2D map in which the absolute value of the target q-axis current Iq_target before correction is U1 and the absolute value of the angular velocity ω is U2. Additionally, FIG. 5 shows a relationship diagram of the arithmetic processing at this time. Note that the angular velocity ω is calculated on the basis of the motor electrical angle θ obtained by the motor rotation angle sensor 51.

$$\alpha \sin 6(\theta+\beta)$$

$$\alpha = Lookuptable\_\alpha(Iq\_target, \omega)$$

$$\beta = Lookuptable\_\beta(Iq\_target, \omega) \quad (3)$$

As shown in FIG. 5, the target q-axis current Iq_target and the angular velocity ω are input to the torque ripple compensation calculation unit 531 and the absolute value U1 of the target q-axis current Iq_target and the absolute value U2 of the angular velocity ω are calculated. The lookup table (2D map) returns the values of the corresponding gain α and phase β from the absolute values U1 and U2.

The lookup table (2D map) shown in FIG. 5 is preferably created, for each of the products including the motor control system 5 and the motor 1, by measuring the transfer characteristics through individual measurement before product shipment, and creating the lookup table individually on the basis of the measured transfer characteristics, for example. Note, however, that as the lookup table (2D map), the transfer characteristics of the same type of motors 1 and motor control systems 5 may be measured as a representative value or an average value and, and a lookup table created on the basis of the transfer characteristics may be widely used among the same type of motors 1. Alternatively, a general-purpose lookup table may be adopted for multiple types of motors 1 and motor control systems 5 that are known to have transfer characteristics similar to each other.

The torque ripple compensation calculation unit 531 calculates a compensation value α sin 6(θ+β) in expressions (2) and (3) using values returned from the lookup table, and outputs the calculated value. The compensation value α sin 6(θ+β) output from the torque ripple compensation calculation unit 531 is superimposed on the target q-axis current Iq_target before correction output from the current limit calculation unit 532.

The motor control system 5 of the present embodiment adds the compensation value of the q-axis current value output from the torque ripple compensation calculation unit 531 to the q-axis current value processed by the current limit calculation unit 532. Note that the compensation value α sin 6(θ+β) is a value used to cancel the component of the q-axis current attributable to the torque ripple. That is, the compensation value α sin 6(θ+β) is calculated on the basis of an angular velocity component and an antiphase component of the sixth harmonic component of the command value (order component of torque ripple).

In other words, in the present embodiment, based on the relational expression in which the inverse characteristic of the current controller is divided into the gain and the phase (advance angle), the torque ripple compensation calculation unit 531 obtains values for adjusting the gain and the phase, and the compensation value based on those values is superimposed on the command value. The torque ripple is suppressed by performing compensation from the viewpoint of both the advance angle (i.e., responsivity of current controller) and the torque ripple (i.e., amplitude of torque ripple). As described above, the torque ripple compensation calculation unit 531 generates a compensation value for performing, on the command value of the q-axis current, compensation of the responsivity of the current controller by advance angle control (hereinafter referred to as advance angle compensation), and torque ripple compensation by adding an antiphase component of the torque ripple. Since the order component of the torque ripple is a high frequency component such as the sixth harmonic component of the command value, the responsivity compensation by advance angle control works effectively. Additionally, the value β in the advance angle control processed by the torque ripple compensation calculation unit 531 is a value that compensates the responsivity of the current controller, and thus is usually a value different from 180 degrees.

Moreover, the motor control system 5 subtracts the actual q-axis current value IQR flowing through the inverter from the q-axis current value to which the compensation value has been added as described above, and calculates a current deviation IQ_err of the q-axis current. That is, the motor control system 5 of the present embodiment performs feedback control for controlling the output and the like of the motor by performing PI control, for example, using the current deviation IQ_err of the q-axis current.

Note that while the compensation value $\alpha \sin 6(\theta+\beta)$ is added to the target q-axis current Iq_target after current limiting in the above description, the compensation value $\alpha \sin 6(\theta+\beta)$ may be added to the target q-axis current Iq_target before current limiting and the current limiting may be performed thereafter, or the compensation value $\alpha \sin 6(\theta+\beta)$ may be added to the current deviation IQ_err between the target q-axis current Iq_target and the actual q-axis current value IQR.

As described above, the motor control system 5 of the first embodiment performs control for compensating the responsivity of the current controller in advance. That is, the motor control system 5 uses the feedback control to perform torque ripple compensation and advance angle compensation. Additionally, the advance angle compensation is performed on the basis of the parameter calculated by using the antiphase component of the order component of the torque ripple at the target current value and the angular velocity component. In the present embodiment, based on the relational expression in which the inverse characteristic of the current controller is divided into the gain and the phase, the gain for adjusting (the amplitude of) the torque ripple is calculated, and the phase for adjusting the advance angle is calculated. Then, a compensation value using these values is derived.

By using this compensation value, torque ripple compensation for compensation in terms of amplitude and advance angle compensation for compensation in terms of phase are performed on the torque ripple generated in the motor 1. With this, it is possible to reduce the sensitivity to quantization noise and sensor noise that accompany high-pass filter calculation in the motor control system 5. As a result, the torque ripple is reduced and degradation of the operating noise is prevented. Moreover, the above also improves the robustness of motor control.

Additionally, since the torque ripple compensation is performed by using the antiphase component of the order component of the torque ripple at the current value, the responsivity of the current controller is improved in the low speed region of the motor. Then, since the parameter is calculated using not only the above-described antiphase component of the current value but also the angular velocity component, the responsivity of the current controller is improved even in the high speed region of the motor. Accordingly, the responsivity of the current controller is also improved in a wide range from low speed to high speed.

As the method for compensating the torque ripple using the antiphase component of the current value described above, there are known a method of adding a compensation value to a motor current command value and a method of adding a compensation value to a motor applied voltage command value. In the present embodiment, the compensation value is added to the motor current command value. As a result, stable torque fluctuation correction is performed regardless of motor characteristic fluctuations.

After obtaining the current deviation IQ_err of the q-axis current as described above, the motor control system 5 performs voltage control for calculating a motor applied voltage command value on the basis of the current deviation IQ_err of the q-axis current. Voltage control is performed by the voltage control calculation unit 533. In the present embodiment, PI control is used as voltage control. Note that the voltage control is not limited to PI control, and other control methods such as PID control may be adopted. The voltage control calculation unit 533 calculates a q-axis voltage command value VQ1 by a q-axis PI control unit 5331 on the basis of the current deviation IQ_err of the q-axis current, and adds a non-interference element COR_Q output from a non-interference processing unit 5332 to the q-axis voltage command value VQ1 to calculate a q-axis voltage command value VQ2. The non-interference element COR_Q is a current element added to prevent the d-axis current (voltage) and the q-axis current (voltage) from interfering with each other, for example.

Then, the motor control system 5 performs induced voltage compensation on the q-axis voltage command value VQ2. Induced voltage compensation is performed by the induced voltage compensation calculation unit 534. When driving the motor, the motor is controlled in consideration of the influence of the induced voltage of the motor in addition to the current flowing through the motor. The induced voltage compensation calculation unit 534 performs advance angle control based on the reciprocal of the induced voltage (BEMF) generated in the motor to compensate the induced voltage (BEMF).

That is, the induced voltage compensation calculation unit 534 obtains the reciprocal of the induced voltage (BEMF) generated in the motor, and based on the reciprocal, calculates the compensation value for performing compensation (advance angle compensation) to adjust the advance angle of the voltage (or current). In the present embodiment, the induced voltage compensation calculation unit 534 adds the compensation value for the induced voltage compensation to the q-axis voltage command value VQ2 to calculate a q-axis voltage command value VQ3. Note that if a compensation value based on the reciprocal of the induced voltage model is used, the compensation value may be subtracted from the q-axis voltage command value VQ2 instead of being added. Additionally, this compensation value may be added to the voltage value of each phase after the two-axis/three-phase conversion.

Moreover, the motor control system 5 performs two-axis/three-phase conversion on the q-axis voltage command value VQ3. Two-axis/three-phase conversion is performed by the two-axis/three-phase conversion calculation unit 535 on the basis of the motor electrical angle $\theta$. The two-axis three-phase conversion calculation unit 535 calculates the corresponding q-axis voltage and d-axis voltage on the basis of the q-axis voltage command value VQ3, and converts the voltages into voltage command values in three phases, the U, V, and W phases.

After that, the motor control system performs dead time compensation on the basis of the voltage command value of each phase output from the two-axis/three-phase conversion calculation unit 535. Dead time compensation is performed by the dead time compensation calculation unit 536. First, the dead time compensation calculation unit 536 performs, in a midpoint modulation unit 5363, calculation by midpoint modulation in which a higher harmonic (e.g., third harmonic) that is n times the fundamental wave of the voltage is superimposed. Here, n is a positive integer. By performing the midpoint modulation, the voltage waveform approaches a trapezoidal waveform from $\alpha$ sine waveform. This improves the effective voltage ratio in the inverter 52.

Next, the dead time compensation calculation unit 536 performs dead time compensation. Up to the midpoint modulation unit 5363, the above-described processing for the current deviation IQ_err is performed, and a voltage component that reduces the current deviation IQ_err is calculated. On the other hand, a target IQ two-axis/three-phase conversion unit 5362 receives the target q-axis current Iq_target, and performs two-axis/three-phase conversion on the voltage command value corresponding to the target q-axis current Iq_target. That is, the target IQ two-axis/three-phase conversion unit 5362 calculates the q-axis voltage and d-axis voltage corresponding to the target q-axis current Iq_target, and converts the voltages into voltage command values in three phases, the U, V, and W phases.

Similar to the two-axis/three-phase conversion in the two-axis/three-phase conversion calculation unit 535, the motor electrical angle is also used in the calculation in the two-axis/three-phase conversion of the target IQ two-axis/three-phase conversion unit 5362. Note, however, that in the motor control system 5 of the present embodiment, a motor electrical angle θ2 obtained by subjecting the motor electrical angle θ detected by the sensor to phase compensation is used as the motor electrical angle input to the target IQ two-axis/three-phase conversion unit 5362. The phase compensation is performed by a correction phase compensator 5361, and the phase compensation is performed to compensate the phase shift of the voltage due to the rotation of the motor.

Finally, the motor control system performs PWM control on the basis of voltage command values output from the dead time compensation calculation unit 536. A PWM control command value is calculated by the PWM control calculation unit 537. The PWM control calculation unit 537 controls the voltage of the inverter 52 on the basis of the calculated command value. By the PWM control, a current corresponding to the above-mentioned current command value flows to the motor 1. Note that as described above, the actual q-axis current value IQR flowing in the inverter 52 is fed back.

Note that in the present system, processing such as the voltage control, the induced voltage compensation, the two-axis/three-phase conversion, the dead time compensation, and the PWM control described above, is not limited to the above, and a known technique may be applied as the processing. Additionally, in the present system, these compensations and controls may be omitted if necessary. Additionally, in the following description, a combination of these elements (i.e., processing such as the above-mentioned voltage control, induced voltage compensation, two-axis/three-phase conversion, dead time compensation, and PWM control) is referred to as a controller element C (S). Note that a combination of only the main blocks for performing feedback control such as PI control may be treated as the controller element C (S). Note that a combination of the motor and the inverter is referred to as a plant element P (S).

Figure 6:
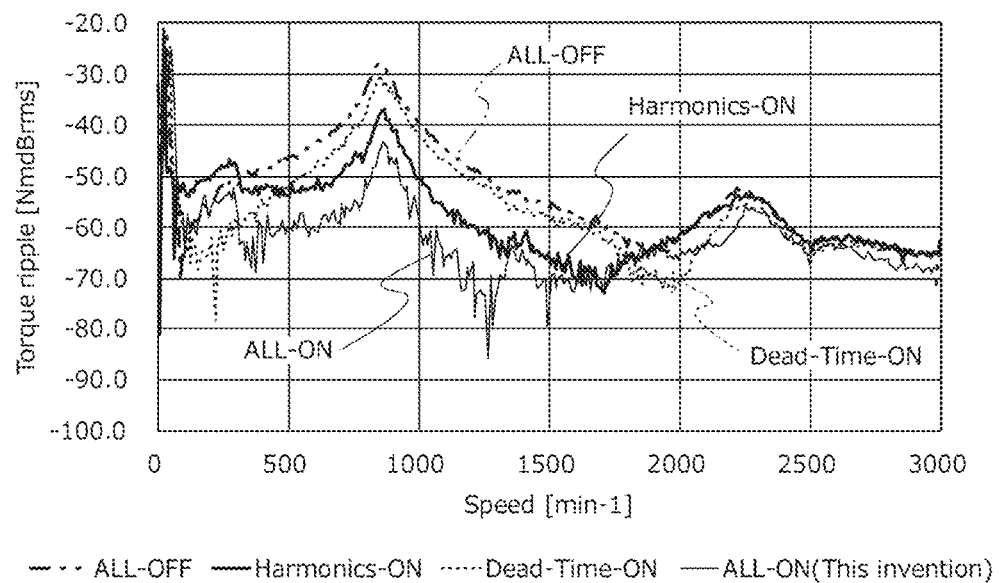
FIG. 6 is a diagram showing a torque ripple simulation result in the first embodiment.

FIG. 6 shows a result obtained by a simulation regarding the first embodiment described above. FIG. 6 is a graph showing the variation of the 24th-order component of the torque (6th-order component of electrical angle) with respect to the rotation speed of the motor. In this simulation, the rotation speed range was 0 [min$^{-1}$] to 3000 [min$^{-1}$], and the result of the torque ripple was obtained in four combinations in which two patterns which are ON and OFF of dead time and two patterns which are ON and OFF of torque fluctuation correction are combined with each other. As can be seen from FIG. 6, when both the dead time compensation and the torque fluctuation correction are turned on, the fluctuation of the motor torque (i.e., torque ripple) becomes small. Accordingly, it can be seen that the first embodiment achieves reduction of the torque ripple and low operating noise.

Second Embodiment

Next, a second embodiment of the present invention in which the output of a torque ripple compensation calculation unit is a "voltage value" will be described. A motor control system of the second embodiment is a control system for a three-phase brushless motor. Note that although description of contents similar to the first embodiment may be omitted in the following, a similar method may be adopted or a different method may be adopted. Note that in the present embodiment, similar to the first embodiment, a torque ripple compensation calculation unit 531 and a phase compensator 5311 have the same functions.

Figure 7:
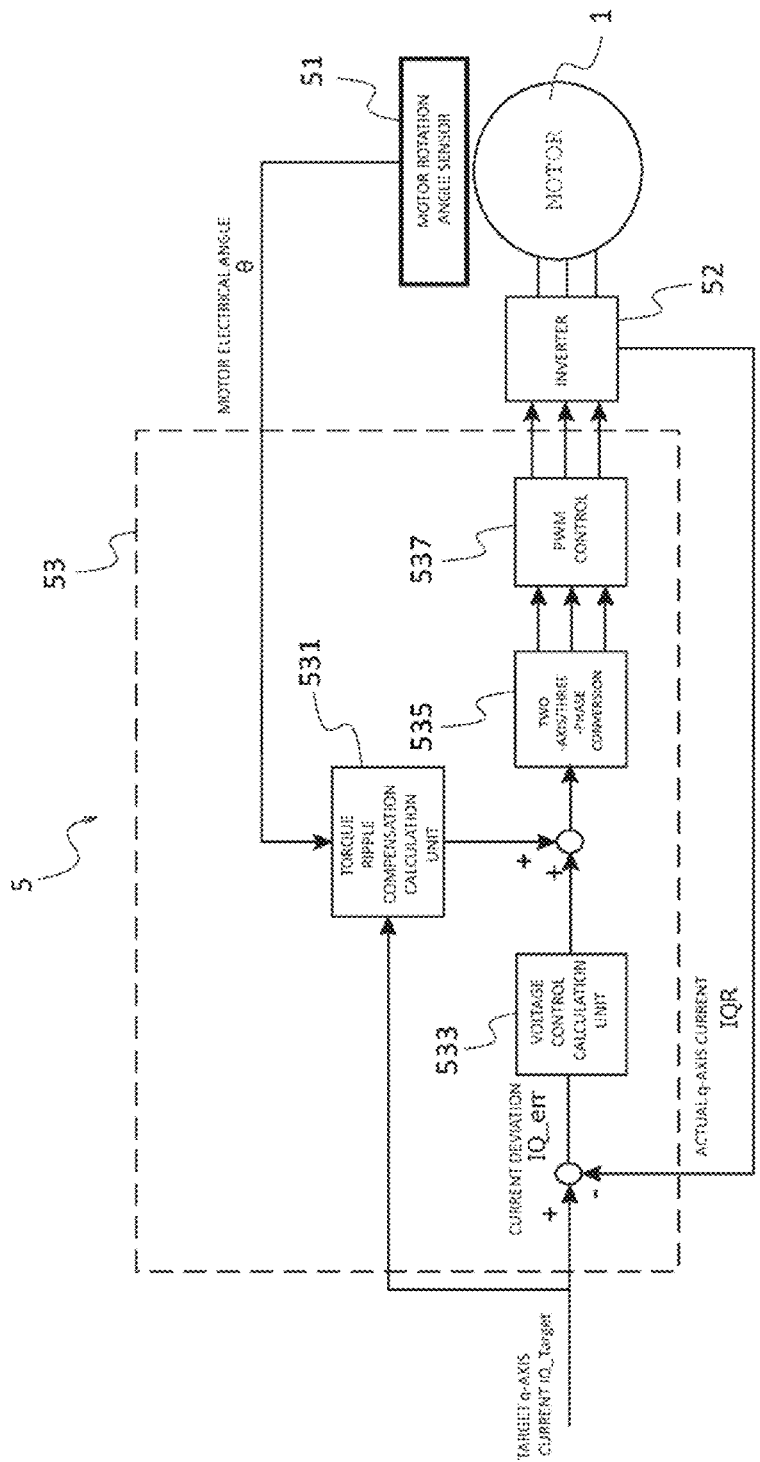
FIG. 7 is a schematic diagram of a motor control system according to a second embodiment.
Figure 8:
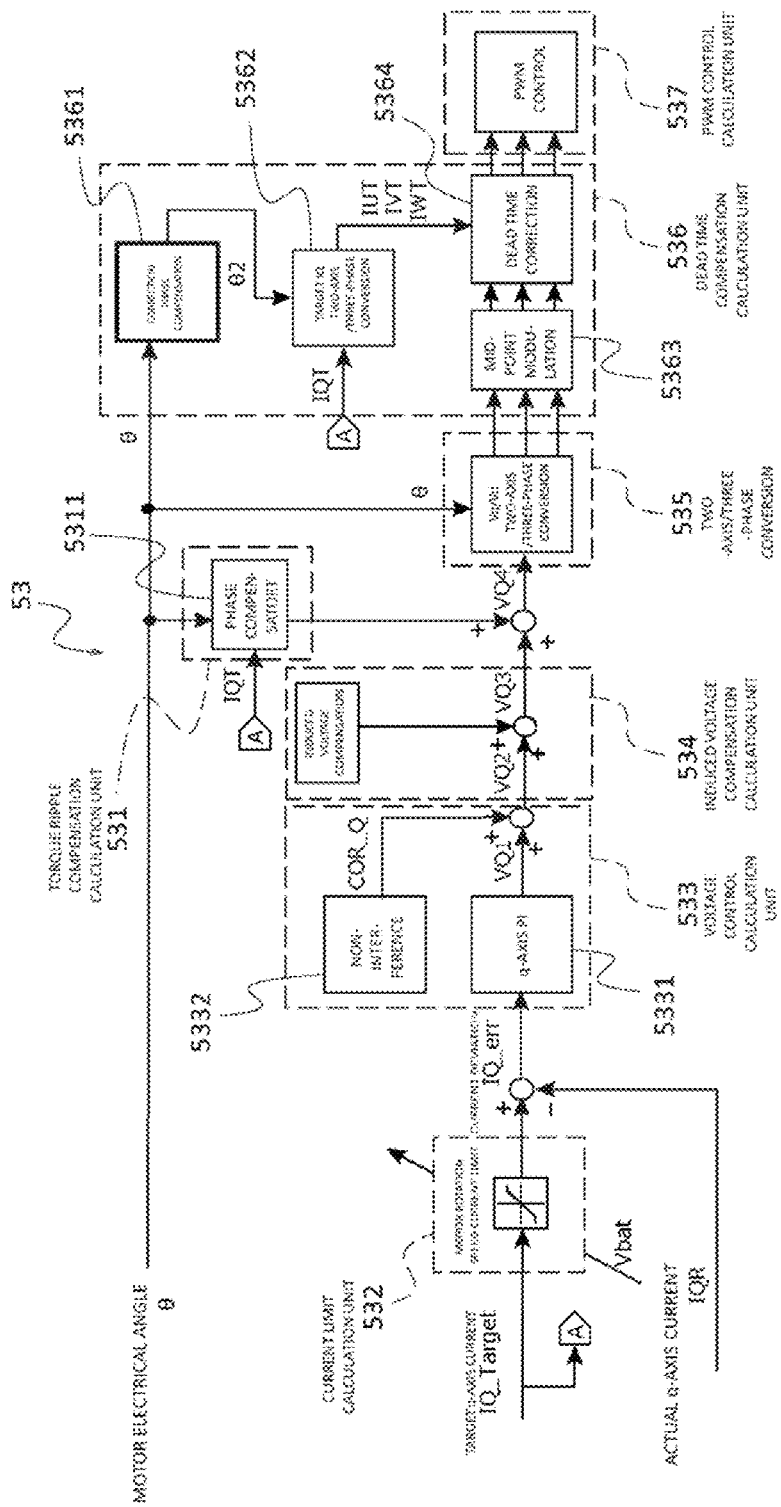
FIG. 8 is a schematic diagram of a control calculation unit of the second embodiment.

FIG. 7 is a schematic diagram of the motor control system of the second embodiment, and FIG. 8 is a schematic diagram of a control calculation unit of the second embodiment. As shown in FIG. 7, a motor control system 5 includes a motor rotation angle sensor 51, an inverter 52, and a control calculation unit 53. As shown in FIG. 8, the control calculation unit 53 includes a torque ripple compensation calculation unit 531, a current limit calculation unit 532, a voltage control calculation unit 533, an induced voltage compensation calculation unit 534, a two-axis/three-phase conversion unit 535, a dead time compensation calculation unit 536, and a PWM control calculation unit 537. The motor control system performs feedback control for feeding back the current value of the inverter 52. Additionally, although not shown, the motor control system 5 may also perform known arithmetic processing such as field weakening control. The motor control system 5 can suppress torque fluctuation in the motor 1 by performing field weakening control.

A target q-axis current Iq_target is input to the motor control system 5 from the outside. An increase or decrease in the motor output is instructed from the outside by increasing or decreasing the target q-axis current Iq_target. The motor control system 5 performs current limiting processing on the target q-axis current Iq_target. Then, the motor control system performs feedback control for subtracting the fed-back actual q-axis current value IQR from the q-axis current after current limiting.

Moreover, the motor control system 5 performs voltage control on a current deviation IQ_err obtained by the feedback control. The voltage control calculation unit 533 calculates a voltage command value VQ1 on the basis of the current deviation IQ_err, and further adds a non-interference element COR_Q that suppresses mutual interference between the d-axis and the q-axis to the voltage command value VQ1. Then, the induced voltage compensation calculation unit 534 adds a compensation value for induced voltage compensation to a q-axis voltage command value VQ2.

Additionally, in the motor control system 5, the torque ripple compensation calculation unit 531 calculates a correction voltage value (torque ripple compensation value) for suppressing the torque ripple on the basis of the target q-axis current Iq_target and an angular velocity ω. Then, unlike the first embodiment, in the second embodiment, the motor control system 5 adds the voltage correction value described above to an output VQ3 (i.e., added value of VQ2 and induced voltage compensation value) of the induced voltage compensation calculation unit 534. As a result, the motor control system 5 can suppress the torque ripple in the motor 1 by adding the compensation value for suppressing the torque ripple to the voltage command value for the inverter 52.

As described above, the motor control system 5 of the second embodiment performs torque ripple compensation for compensating the responsivity of the current controller in advance. That is, the motor control system 5 performs torque ripple compensation and advance angle compensation using feedback control. Similar to the first embodiment, the advance angle compensation is performed on the basis of the parameter calculated by using the antiphase component of the order component of the torque ripple at the target current value and the angular velocity component. In the present embodiment, based on the relational expression in which the inverse characteristic of the current controller is divided into the elements of gain and phase, compensation is performed to set the gain to a value corresponding to the target current value and set the phase to the current advance angle adjustment value. Such compensation makes it possible to reduce the sensitivity to quantization noise and sensor noise that accompany high-pass filter calculation in the motor control system. As a result, the torque ripple generated in the motor is reduced and degradation of the operating noise is prevented. Moreover, the robustness of control in the motor control system is also improved.

Additionally, in the second embodiment, similar to the first embodiment, since the torque ripple compensation in which the compensation value is calculated on the basis of the antiphase component of the order component of the torque ripple at the command current value is performed, the current controller responsivity is improved in the low speed region of the motor. Then, in the second embodiment, similar to the first embodiment, since the parameter is calculated based not only on the antiphase component of the current value but also the angular velocity co, the responsivity of the current controller is improved even in the high speed region of the motor. Accordingly, the responsivity of the current controller is also improved in a wide range from low speed to high speed.

Here, the difference between the first embodiment and the second embodiment is that the output from the torque ripple compensation calculation unit 531 is changed from a current value to a voltage value, and that addition points in the control flow are changed accordingly. As a result, since the output by the torque fluctuation compensation is determined only by the electric characteristics of the motor, there is an advantage that torque fluctuation can be easily adjusted. Additionally, another advantage is that since the compensation value of the torque ripple is added to the voltage value, the arithmetic processing is faster than when the compensation value is added to the current value.

Note that since the current control, induced voltage compensation, two-axis/three-phase conversion, dead time compensation, and PWM control in the second embodiment are similar to those in the first embodiment, the description thereof will be omitted. Note that in the second embodiment, known techniques may be applied to these compensations and controls. Additionally, in the second embodiment, these compensations and controls may be omitted if necessary. Additionally, a combination of these elements may be treated as a controller element C (S), and a combination of only the main blocks for performing feedback control may be treated as the controller element C (S). Note that a combination of the motor and the inverter is referred to as a plant element P (S).

Next, other embodiments will be described. The contents described in other embodiments are applicable to both the first embodiment and the second embodiment.

Figure 9A:
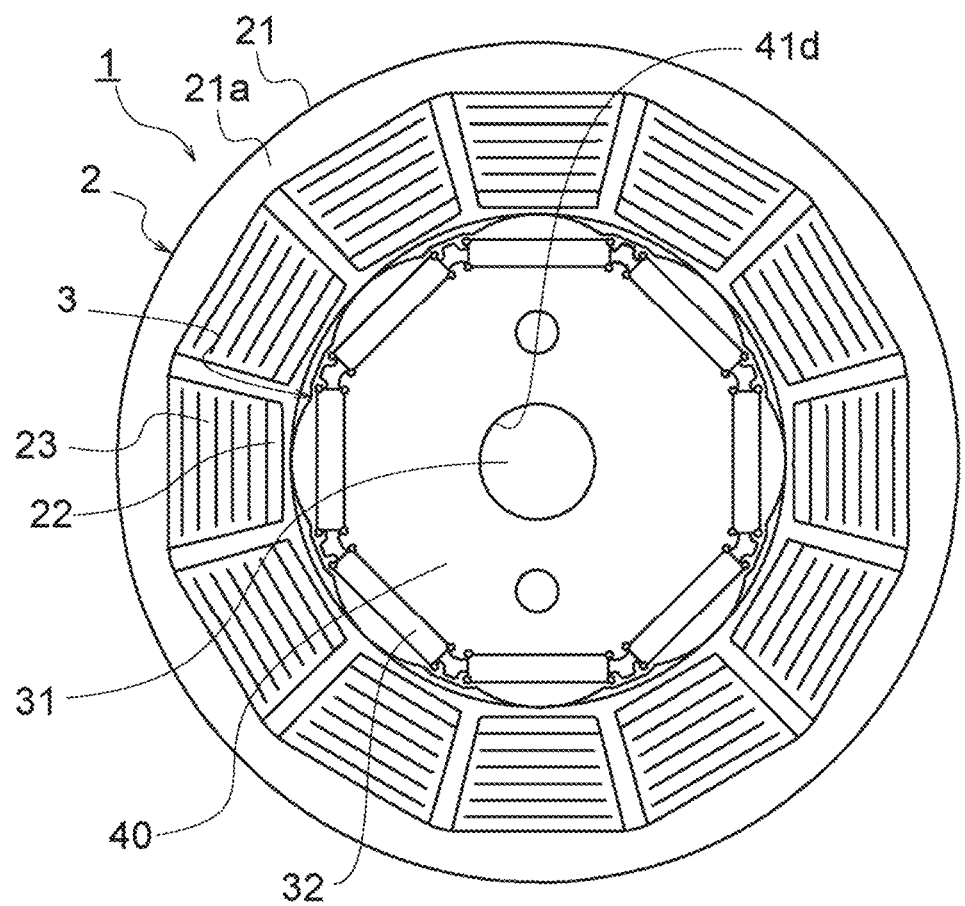
FIG. 9a is a plan view of a first motor according to the present embodiment.
Figure 9B:
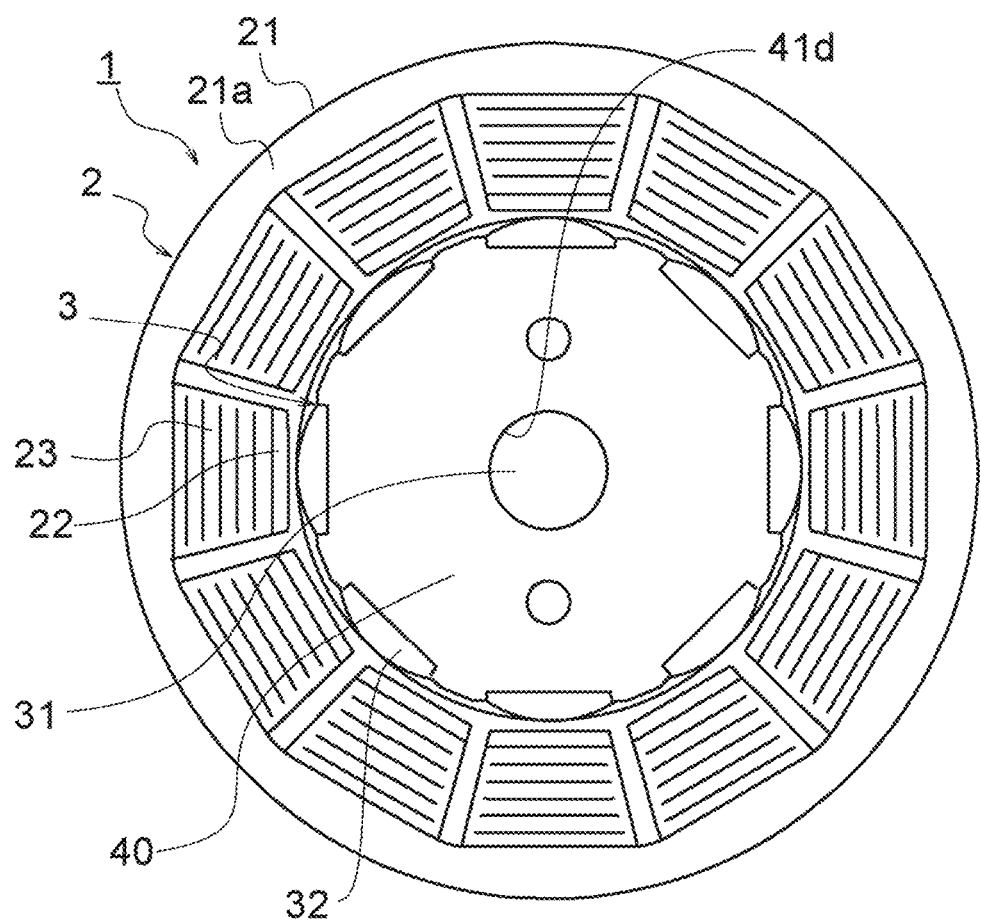
FIG. 9b is a plan view of a second motor according to the present embodiment.

Here, an outline of a motor that can be controlled by the above-described embodiments will be described. FIG. 9a is a plan view of a first motor according to the present embodiment, and FIG. 9b is a plan view of a second motor according to the present embodiment. Each of motors 1 shown in FIGS. 9a and 9b has a stator 2 and a rotor 3. As shown in FIGS. 9a and 9b, the motor 1 is an inner rotor. Note that in addition to the inner rotor, an outer rotor structure may be adopted as the motor 1. The first motor 1 shown in FIG. 9a is an interior permanent magnet (IPM) motor, and the second motor 1 shown in FIG. 9b is a surface permanent magnet (SPM) motor.

The stator 2 has a cylindrical outer shape extending in the axial direction. The stator 2 is arranged outside the rotor 3 in the radial direction with a predetermined gap from the rotor 3. The stator 2 has a stator core 21, an insulator 22, and a coil 23. The stator core 21 is a tubular member extending in the axial direction. The stator core 21 is formed by stacking multiple magnetic steel plates in the axial direction. The stator core 21 has a core back 21a and teeth (not shown). The core back 21a is a ring-shaped portion. The teeth extend radially inward from an inner peripheral surface of the core back 21a. Multiple teeth are arranged side by side at predetermined intervals in the circumferential direction. Additionally, the space between adjacent teeth is called a slot S. In the motor 1 shown in FIGS. 9a and 9b, 12 slots S are provided, for example.

The rotor 3 has a cylindrical outer shape extending in the axial direction. The rotor 3 is arranged inside the stator 2 in the radial direction with a predetermined gap from the stator 2. The rotor 3 has a shaft 31, a rotor core 40, and a magnet 32. The rotor 3 rotates about the shaft 31 extending in the up-down direction (direction perpendicular to sheet surface of FIGS. 9a and 9b). The rotor core 40 is a cylindrical member extending in the axial direction. The shaft 31 is inserted into a hole 41d located at the center of the rotor core 40 in the radial direction. The rotor core 40 is configured by stacking multiple magnetic steel plates in the axial direction. The magnet 32 is arranged inside the rotor core 40 in the first motor 1 shown in FIG. 9a, and is attached to the surface of the rotor core 40 in the second motor 1 shown in FIG. 9b. Multiple magnets 32 are arranged side by side at predetermined intervals in the circumferential direction. In each of the motors 1 shown in FIGS. 9a and 9b, eight magnets 32 are provided, for example. That is, in each of the motors 1 shown in FIGS. 9a and 9b, the number of poles P is eight.

The magnetic characteristic of the motor differs depending on the number of poles P and the number of slots S described above. Here, causes of operating noise mainly include radial force and torque ripple. In the case of an 8P12S motor having eight poles P and 12 slots S, radial forces that are radial components of the electromagnetic force generated between the rotor and the stator cancel out each other, and therefore torque ripple is the main cause of operating noise. In other words, by compensating the torque ripple alone with the motor control system described above, the operating noise of the 8P12S motor is efficiently reduced. Accordingly, the motor control system of the present invention is particularly useful for 8P12S motors.

Since radial force cancellation is particularly effective in SPM motors, the motor control system of the present invention is particularly useful in SPM motors. More specifically, in SPM motors, reluctance torque does not occur and only magnet torque contributes. For this reason, by adopting the present invention, vibration reduction is achieved by compensating the magnet torque alone. Conversely, since the cancellation of radial force is not an effect that occurs exclusively in SPM motors and 8P12S motors, but is an effect that occurs also in IPM motors or 10P12S motors, for example, the motor control system of the present invention is also useful in IPM motors, or is also useful in 10P12S motors, for example.

Figure 10:
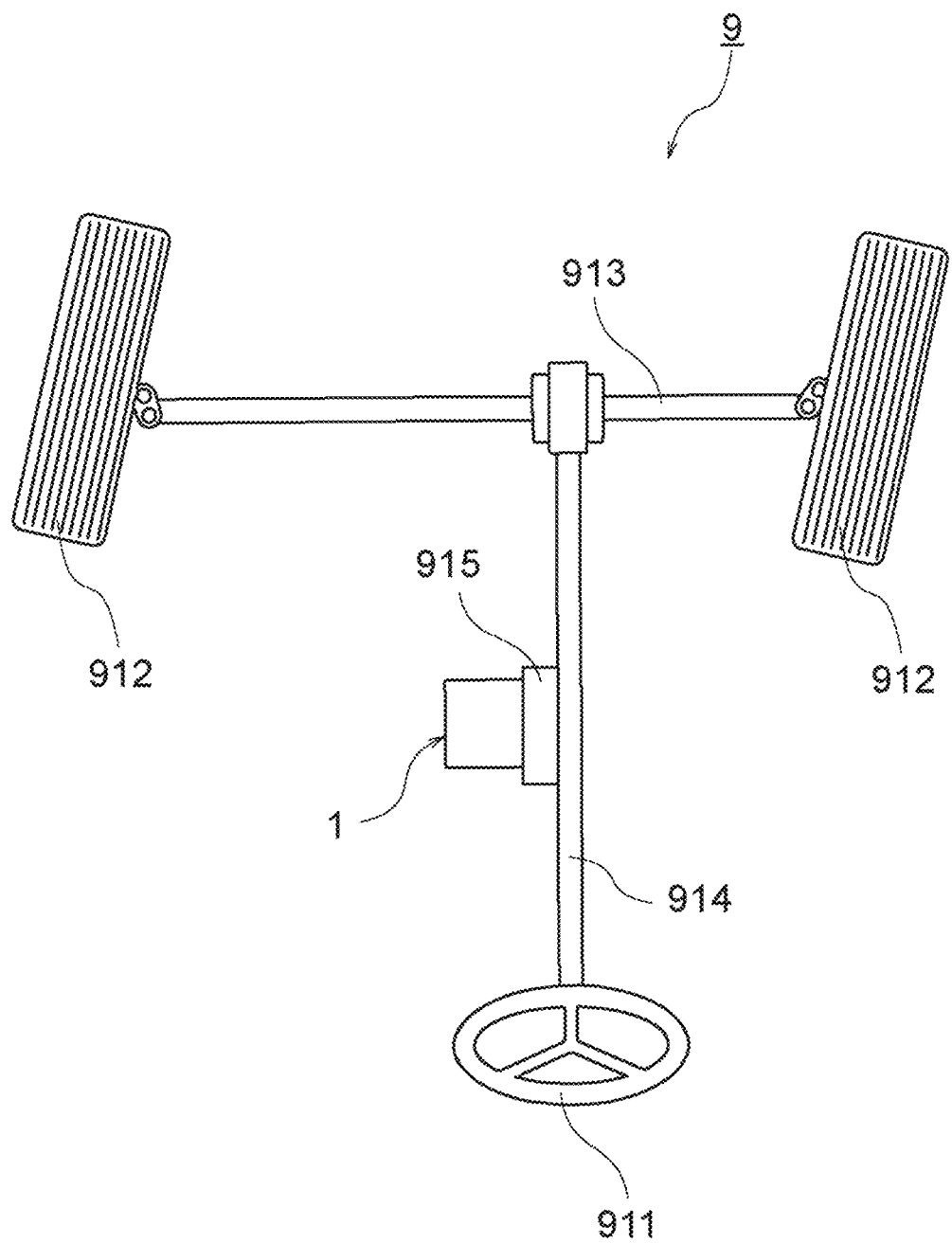
FIG. 10 is a schematic diagram of an electric power steering device according to the present embodiment.

Next, an outline of an electric power steering device will be described. As shown in FIG. 10, in the present embodiment, a column type electric power steering device will be exemplified. An electric power steering device 9 is mounted on a steering mechanism for vehicle wheels. The electric power steering device 9 is a column-type power steering device that directly reduces the steering force by the power of a motor 1. The electric power steering device 9 includes the motor 1, a steering shaft 914, and an axle 913.

The steering shaft 914 transmits an input from a steering 911 to the axle 913 having wheels 912. The power of the motor 1 is transmitted to the steering shaft 914 through a coupling 915 including gears and the like. The motor 1 used in the column-type electric power steering device 9 is provided inside an engine room (not shown). Note that while the electric power steering device 9 shown in FIG. 10 is of a column type as an example, the power steering device of the present invention may be of a rack type.

Here, in an application such as the electric power steering device 9 that requires low torque ripple and low operating noise, both effects can be achieved by controlling the motor 1 with the motor control system 5 described above. The reason is that the effect of torque ripple compensation is created by compensating the responsivity of the current controller for the torque ripple of the frequency that exceeds the responsivity of current control without using a high-pass filter that amplifies noise. For this reason, the present invention is particularly useful in a power steering device.

The present invention is also useful for applications other than power steering devices. For example, the present invention is useful for motors such as traction motors (running motors), compressor motors, and oil pump motors that require a reduction in operating noise. Hereinafter, a motor unit including a traction motor will be described.

Figure 11:
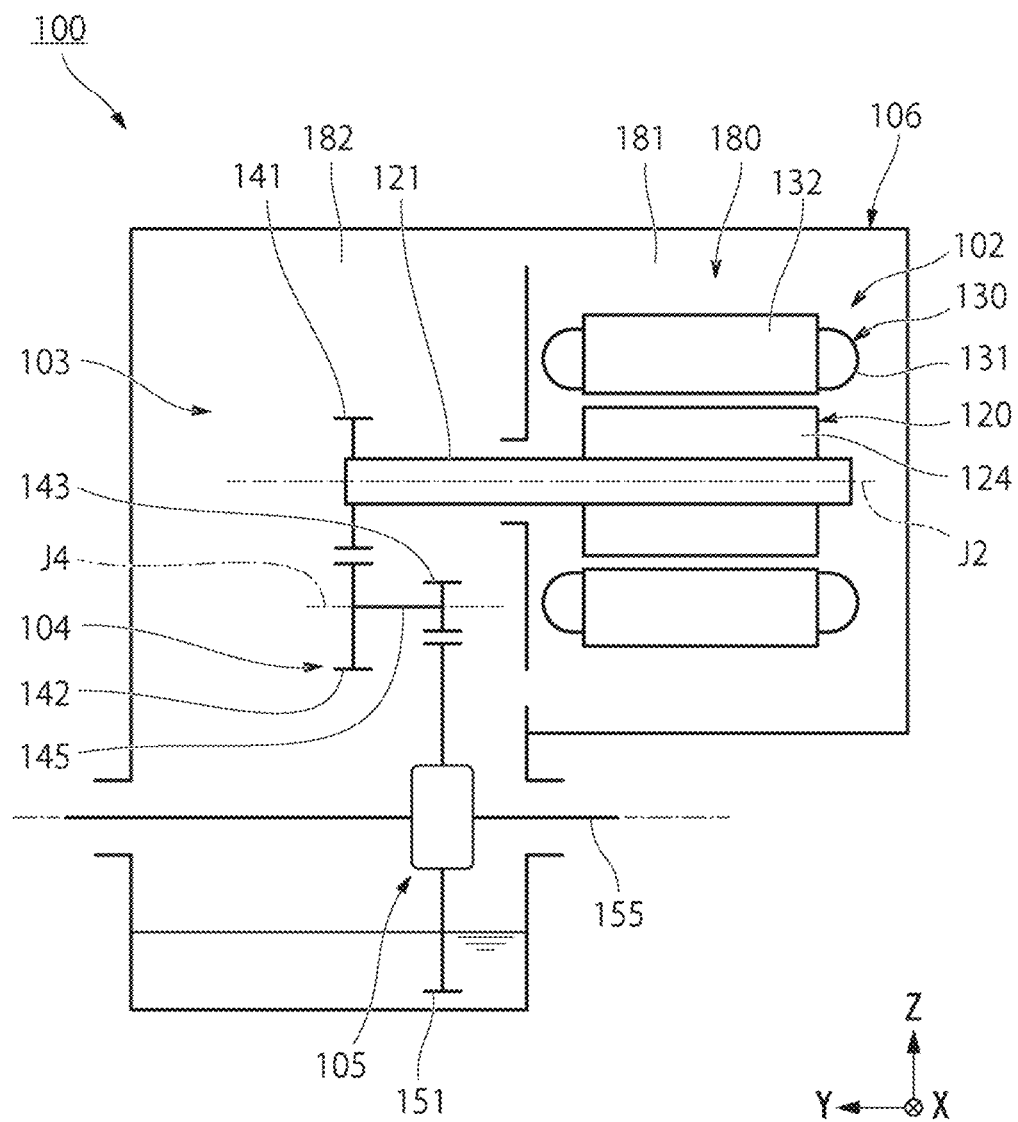
FIG. 11 is a conceptual diagram of a motor unit including a traction motor.
Figure 12:
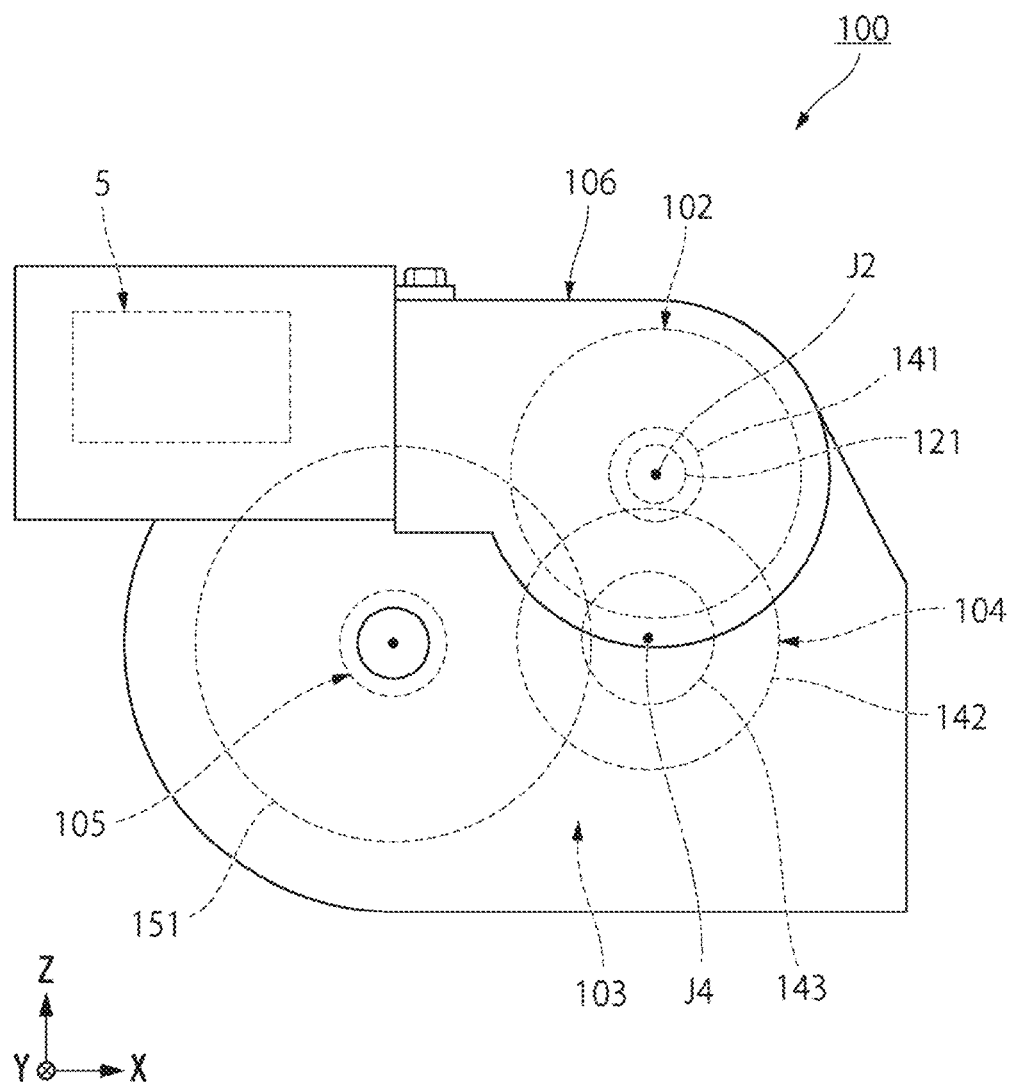
FIG. 12 is a schematic side view of the motor unit.

In the following description, unless otherwise specified, a direction parallel to a motor axis J2 of a motor 102 will be simply referred to by the term "axial direction", radial directions centered on the motor axis J2 will be simply referred to by the term "radial direction", and a circumferential direction centered on the motor axis J2, that is, a circumferential direction about the motor axis J2, will be simply referred to by the term "circumferential direction". Note, however, that the above "parallel direction" includes a substantially parallel direction. FIG. 11 is a conceptual diagram of a motor unit 100 including a traction motor, and FIG. 12 is a schematic side view of the motor unit 100.

The motor unit 100 is installed in a vehicle having a motor as a power source, such as a hybrid electric vehicle (HEV), a plug-in hybrid vehicle (PHV), or an electric vehicle (EV), for example, and is used as the power source thereof. The motor unit 100 of the present embodiment includes a motor (main motor) 102, a gear portion 103, a housing 106, and a motor control system 5.

As shown in FIG. 11, the motor 102 includes a rotor 120 that rotates about a motor axis J2 that extends in the horizontal direction, and a stator 130 that is located radially outside the rotor 120. A housing space 180 for housing the motor 102 and the gear portion 103 is provided inside the housing 106. The housing space 180 is divided into a motor chamber 181 for housing the motor 102 and a gear chamber 182 for housing the gear portion 103.

The motor 102 is housed in the motor chamber 181 of the housing 106. The motor 102 includes the rotor 120 and the stator 130 located outside the rotor 120 in the radial direction. The motor 102 is an inner rotor type motor including the stator 130 and the rotor 120 rotatably arranged inside the stator 130.

The rotor 120 rotates when electric power is supplied to the stator 130 through the motor control system 5 from a battery (not shown). The rotor 120 has a shaft (motor shaft) 121, a rotor core 124, and a rotor magnet (not shown). The rotor 120 (i.e., the shaft 121, the rotor core 124, and the rotor magnet) rotates about the motor axis J2 extending in the horizontal direction. The torque of the rotor 120 is transmitted to the gear portion 103. The shaft 121 extends about a motor axis J2 extending horizontally and in the vehicle width direction. The shaft 121 rotates about the motor axis J2.

The shaft 121 extends across the motor chamber 181 and the gear chamber 182 of the housing 106. One end of the shaft 121 projects toward the gear chamber 182. A first gear 141 is fixed to the end of the shaft 121 protruding into the gear chamber 182.

The rotor core 124 is configured by stacking silicon steel plates (magnetic steel plates). The rotor core 124 is a columnar body extending along the axial direction. Multiple rotor magnets are fixed to the rotor core 124.

The stator 130 surrounds the rotor 120 from the outside in the radial direction. In FIG. 11, the stator 130 has a stator core 132 and a coil 131. The stator 130 is held by the housing 106. Although not shown, the stator core 132 has multiple magnetic pole teeth extending radially inward from an inner peripheral surface of an annular yoke. A coil wire (not shown) is wound around the magnetic pole teeth to form a coil 131.

The gear portion 103 is housed in the gear chamber 182 of the housing 106. The gear portion 103 is connected to the shaft 121 on one axial side of the motor axis J2. The gear portion 103 has a speed reducer 104 and a differential 105. A torque output from the motor 102 is transmitted to the differential 105 through the speed reducer 104.

The speed reducer 104 is connected to the rotor 120 of the motor 102. The speed reducer 104 has a function of increasing the torque output from the motor 102 in accordance with a reduction ratio while reducing the rotation speed of the motor 102. The speed reducer 104 transmits the torque output from the motor 102 to the differential 105.

The speed reducer 104 has a first gear (intermediate drive gear) 141, a second gear (intermediate gear) 142, a third gear (final drive gear) 143, and an intermediate shaft 145. The torque output from the motor 102 is transmitted to a ring gear (gear) 151 of the differential 105 through the shaft 121 of the motor 102, the first gear 141, the second gear 142, the intermediate shaft 145, and the third gear 143.

The differential 105 is connected to the motor 102 through the speed reducer 104. The differential 105 is a device for transmitting the torque output from the motor 102 to wheels of the vehicle. The differential 105 has a function of transmitting the same torque to axles 155 of right and left wheels while absorbing a difference in speed between the right and left wheels when the vehicle is turning.

The motor control system 5 is electrically connected to the motor 102. The motor control system 5 supplies electric power to the motor 102 with an inverter. The motor control system 5 controls the current supplied to the motor 102. The motor control system 5 compensates the torque ripple to reduce the operating noise of the motor 102.

Figure 13:
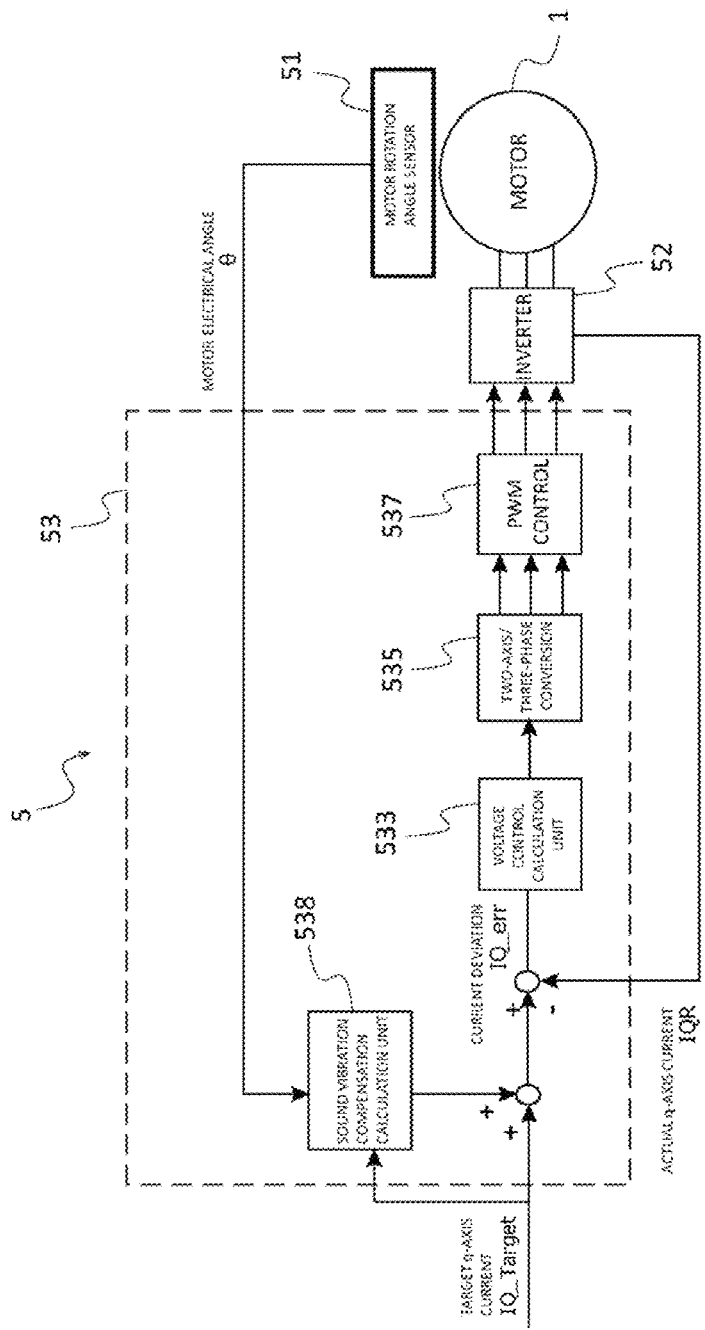
FIG. 13 is a schematic diagram of a motor control system of a third embodiment.

For example, when the motor 1 is incorporated in the electric power steering device 9 as shown in FIG. 10, sound vibration (noise) occurs due to resonance or the like from coupling of the motor 1 and other elements, and the reduction of torque ripple described above may be insufficient to achieve low operating noise. Hereinafter, an embodiment for reducing such sound vibration (noise) will be described. FIG. 13 is a schematic diagram of a motor control system of a third embodiment, and FIG. 14 is a schematic diagram of a control calculation unit of the third embodiment.

A motor control system 5 of the third embodiment includes a sound vibration compensation calculation unit 538 instead of the torque ripple compensation calculation unit 531 of the first embodiment. Note that here, for the sake of simplicity of description, an example in which the sound vibration compensation calculation unit 538 is provided instead of the torque ripple compensation calculation unit 531 will be described. However, the motor control system 5 may include both the torque ripple compensation calculation unit 531 and the sound vibration compensation calculation unit 538.

Figure 14:
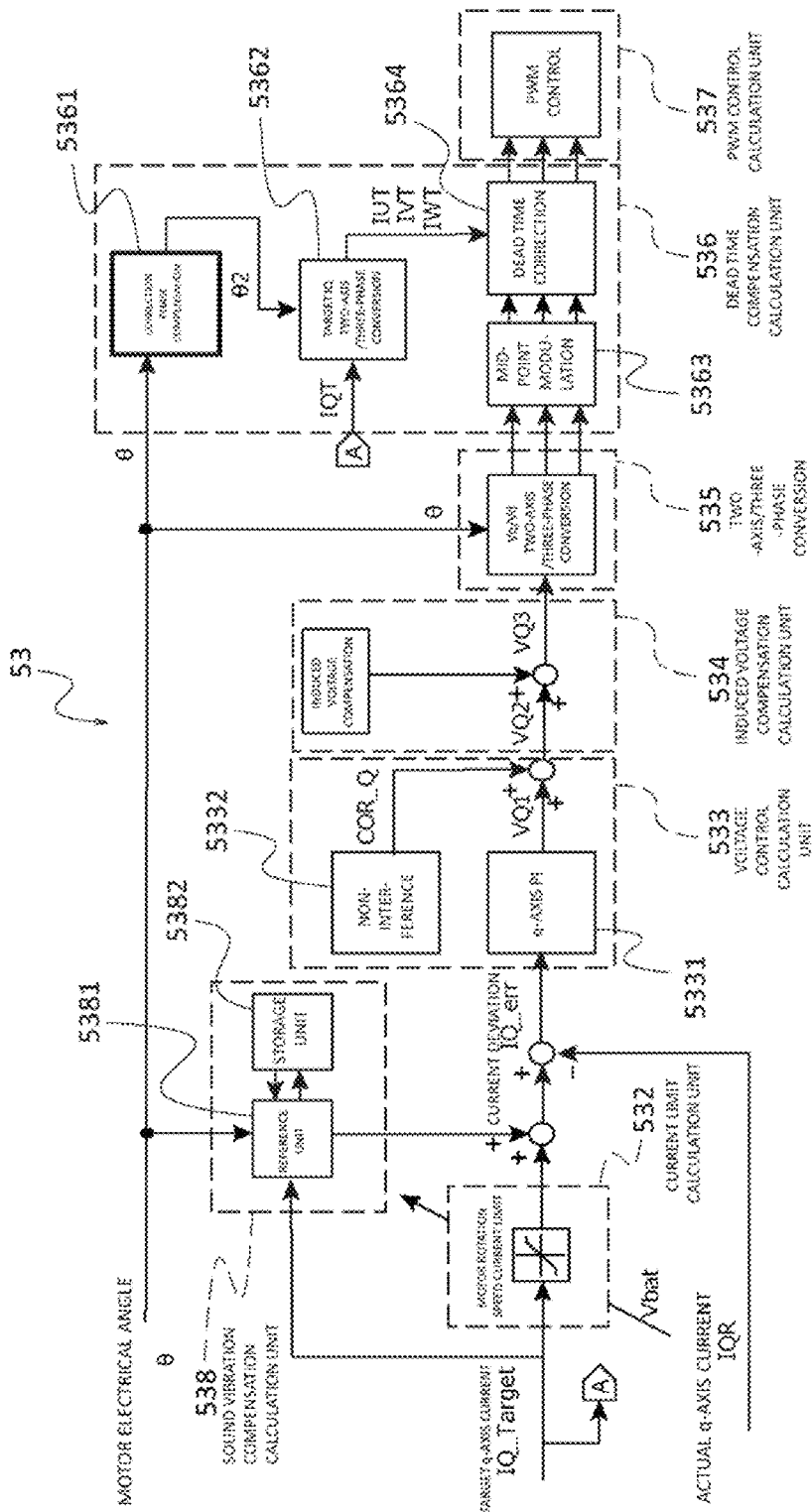
FIG. 14 is a schematic diagram of a control calculation unit of the third embodiment.

As shown in FIG. 14, the sound vibration compensation calculation unit 538 includes a storage unit 5382 that stores a lookup table, and a reference unit 5381 that obtains a compensation value by referring to the lookup table. The lookup table stored in the storage unit 5382 is a two-dimensional lookup table that obtains a reference value using a target q-axis current value Iq_target and a motor rotation speed ω. A compensation value γ obtained by the sound vibration compensation calculation unit 538 is obtained by following expression (4).

$$\gamma = A \sin(B\theta + C)$$

$$A = \text{Lookuptable\_}A(Iq\_target, \omega)$$

$$C = \text{Lookuptable\_}C(Iq\_target, \omega) \quad (4)$$

That is, in the lookup table stored in the storage unit 5382, a gain A and a phase C are obtained as reference values. Additionally, an order B with respect to the electric angle θ of the motor is a fixed value given to the lookup table, and is an order selected from the k-th order and the 1/k-th order (k is an integer). In other words, the lookup table is a recording table in which the compensation value γ in the order B is recorded. Note that as the recording method of the compensation value γ, a recording method based on an approximate expression of the compensation value γ may be used other than the lookup table.

As the lookup table, multiple lookup tables having different orders B may be stored. In such a case, the sound vibration compensation calculation unit 538 calculates each compensation value γ by the above expression (4) from the gain A and the phase C obtained from each lookup table, and outputs a value obtained by adding the compensation values γ together as a compensation value. That is, the sound vibration compensation calculation unit 538 compensates at least one of the k-th component and the 1/k-th component in the rotation of the motor. FIG. 15 is a diagram showing a lookup table stored in the storage unit 5382. The storage unit 5382 stores a first table T1 in which the gain A is obtained as a reference value and a second table T2 in which the phase C is obtained as a reference value.

In each of the lookup tables T1 and T2, a change in motor rotation speed ω corresponds to a row change, and a change in target current value corresponds to a column change. That is, a lower row is referred to as the motor rotation speed ω increases, and a column further to the right is referred to as the target current value increases. Although the lookup table of m rows and n columns is shown in the example shown in FIG. 15, generally, the motor rotation speed ω and the target current value have values corresponding to between rows and between columns. For this reason, the reference values are obtained by linear interpolation, for example, on the basis of the values described in the lookup tables T1 and T2.

The reference unit 5381 shown in FIG. 14 calculates the compensation value γ by substituting the gain A and the phase C obtained by referring to the lookup table into γ=A sin(Bθ+C). Similar to the first embodiment, the compensation value γ is superimposed (added) on the target q-axis current Iq_target before correction output from a current limit calculation unit 532. Such addition of the compensation value γ reduces the sound vibration (noise) due to resonance or the like in the coupled system in the motor control system 5 of the third embodiment.

Figure 16:
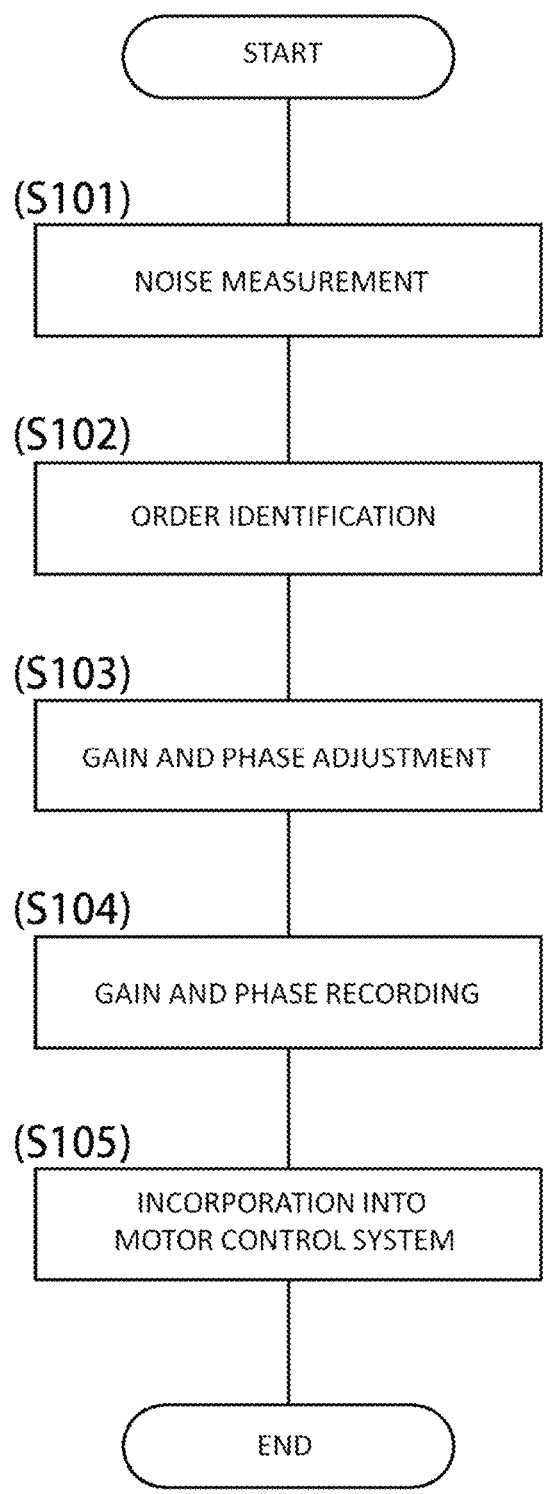
FIG. 16 is a diagram showing a procedure for adjusting and recording a compensation value γ.

Hereinafter, a procedure for adjusting the compensation value γ for reducing sound vibration (noise) due to resonance or the like, and recording the compensation value γ as a lookup table will be described. FIG. 16 is a diagram showing a procedure for adjusting and recording the compensation value γ.

Figure 17:
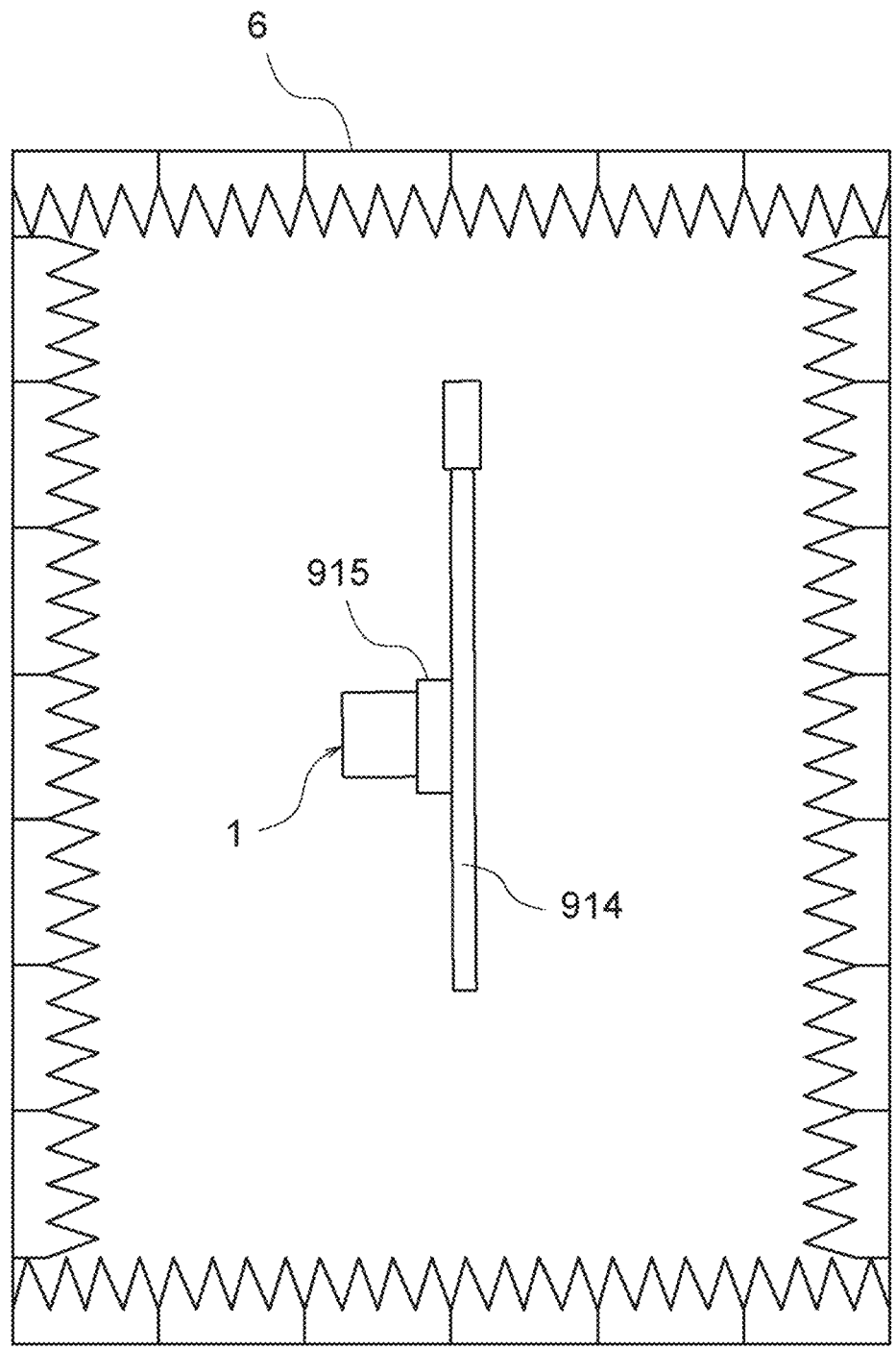
FIG. 17 is a diagram schematically showing a situation of noise measurement.

First, in step S101, noise is measured with respect to a coupled system in which a motor and at least a part of a steering mechanism are coupled, as a coupled system including a motor and a driving body coupled to the motor and driven by the motor. Such measurement is suitably used for the column-type power steering mechanism as shown in FIG. 10. Note that in the case of a rack-type power steering mechanism, the compensation value γ can be obtained on the basis of the measurement result of the column-type power steering mechanism. FIG. 17 is a diagram schematically showing a situation of noise measurement in step S101 of FIG. 16.

Figure 18:
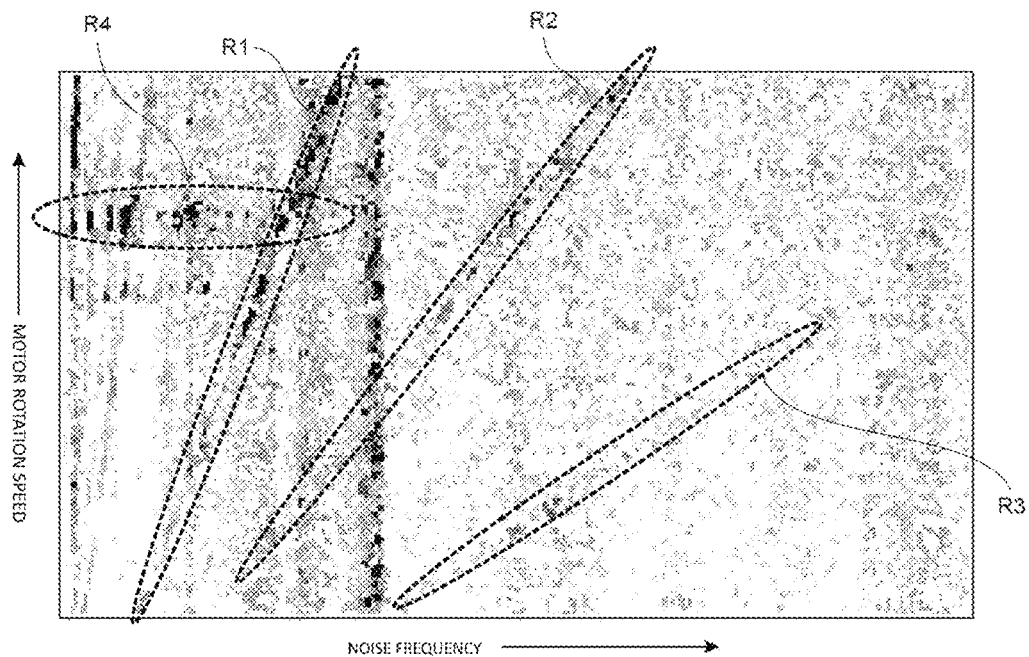
FIG. 18 is a graph showing an example of noise data obtained by noise measurement.

Here, a situation is shown where a coupled system in which a motor 1 and a steering shaft 914 are coupled by a coupling 915 is installed in a soundproof room 6, and the coupled system is driven in the soundproof room 6 to measure the noise. FIG. 18 shows an example of noise data obtained by the noise measurement in step S101 of FIG. 16

The horizontal axis of the graph in FIG. 18 represents each frequency obtained by dividing noise into frequency components, and the vertical axis represents the rotation speed of the motor. Additionally, the magnitude of (component of) noise is expressed by the density of the dots in the graph, and the darker the color of the dots, the greater the noise.

In the graph, regions R1, R2, and R3 in which high noise dots are connected in a diagonal line are shown. These regions R1, R2, and R3 are regions in which the frequency of noise is proportional to the rotation speed of the motor, and one region corresponds to one order in the order component of the rotation of the motor.

Additionally, in the graph, a region R4 in which high noise dots are concentrated in a band shape near a specific motor rotation speed is also shown. The region R4 corresponds to a resonance band in the coupling that couples the motor and the steering mechanism.

When such noise data is obtained in step S101 of FIG. 16, next, in step S102, the above-mentioned order B is identified. That is, of the order components in the rotation of the motor, the order B of the component contributing to noise compensation is identified. The component that contributes to noise compensation is a component that is included in a large amount in noise, for example.

Two types of methods will be described here as methods for identifying the order. In a first method, the order components in the rotation of the motor are compared with each other to identify the order B of the component with large noise. That is, the regions R1, R2, and R3 of the order components shown in FIG. 18 are compared with each other, and the order of the region with large noise is identified.

In a second method, a band with large noise is focused on from among bands of the rotation speed of the motor, and in the band, the order B of the component with large noise is identified. That is, the band-shaped region R4 shown in FIG. 18 is focused on, and the order of the order component with large noise in the band-shaped region R4 is identified.

In the case of the noise data shown in FIG. 18, the 24th order (order in electrical angle) that is the order corresponding to the region R1 shown in FIG. 18 is identified when any of the above two methods is used. The identified 24th order corresponds to the common multiple (particularly, least common multiple here) of the number of poles (8) and the number of slots (12) in the motor 1 exemplified in FIGS. 9a and 9b.

Figure 19:
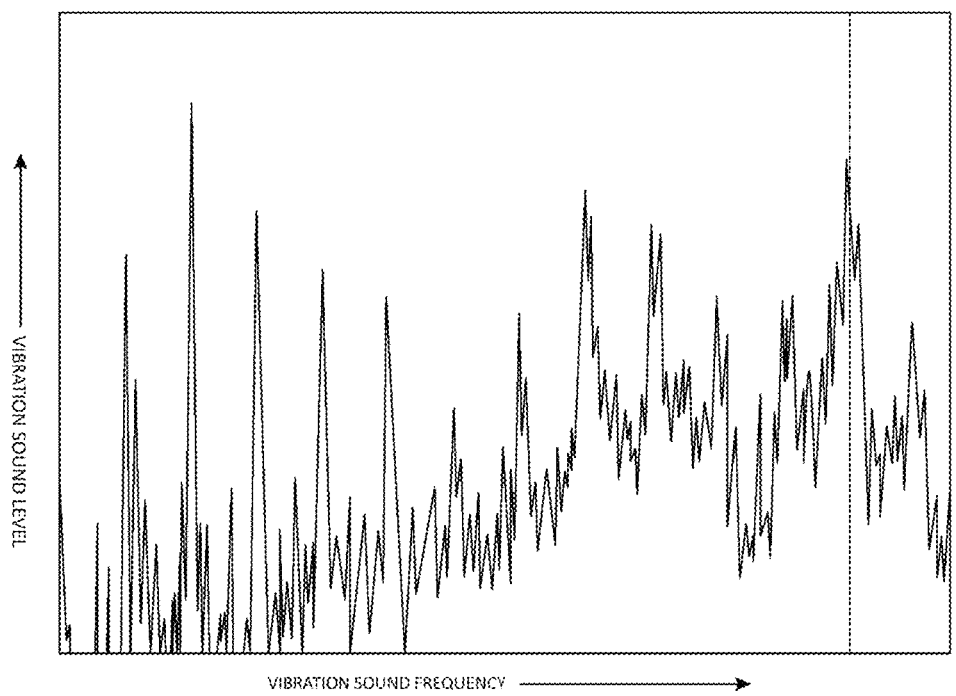
FIG. 19 is a diagram showing an example of a monitored noise level.

When the order B is identified in step S102, next, the gain and the phase are adjusted in step S103. That is, driving of the motor 1 is controlled by using the component of the identified order B (e.g., mechanical angle is 6th order when electrical angle is 24th order) as a compensation value, and the component value of the order B is adjusted to reduce noise. More specifically, a compensation value $\gamma = A\sin(B\theta + C)$ based on the arbitrarily adjusted gain A and phase C is used as the output value of the sound vibration compensation calculation unit 538 shown in FIGS. 13 and 14. Here, the value of the order component B of the mechanical angle is used to calculate the compensation value $\gamma$. Then, under the control of a control calculation unit 53, the motor 1 is driven at a specific rotation speed with large noise, and while the noise level is monitored, the gain A and the phase C are adjusted to values that reduce the noise level. That is, the gain and the phase are adjusted as the component value of the order B. FIG. 19 is a diagram showing an example of a monitored noise level. The horizontal axis of FIG. 19 represents the noise frequency, and the vertical axis represents the noise level.

The noise waveform exemplified in FIG. 19 corresponds to the noise waveform of a constant rotation speed in the region R4 in FIG. 18, and the noise level expressed by the density of dots in FIG. 18 is expressed in height in the vertical axis direction in FIG. 19. Each peak occurring in the noise waveform of FIG. 19 corresponds to each order component, and the position of the broken line shown near the right end in FIG. 19 corresponds to the above-described specific order B (e.g., 24th order in electrical angle). When the gain A and the phase C in the specific order B are appropriately adjusted, not only the peak of the order B (e.g., 24th order in electrical angle), but also the noise waveform exemplified in FIG. 19 is reduced as a whole.

That is, by appropriately adjusting the gain A and the phase C in the specific order B, the noise in the entire region R4 corresponding to the resonance band in the coupling that couples the motor and the steering mechanism is reduced (compensated).

In step S103 of FIG. 16, such adjustment of the gain A and the phase C for reducing noise is executed at each of the multiple motor rotation speeds, and a series of gains A and a series of phases C are obtained. Then, in step S104, the series of gains A and the series of phases C are recorded as one column of the lookup tables T1 and T2 shown in FIG. 15. That is, the component value of the order B is recorded as a table map.

In step S103, furthermore, the above procedure is repeated for each of the multiple target q-axis currents Iq_target, and in step S104, the gain A and the phase C are recorded in each column of the lookup tables T1 and T2 shown in FIG. 15.

When the gain A and the phase C are recorded in the lookup tables T1 and T2 in step S104, the lookup tables T1 and T2 are recorded (stored) in the storage unit 5382 of the sound vibration compensation calculation unit 538 in the motor control system 5 in step S105. The motor control system 5 is implemented by a microcomputer, for example, and the lookup tables T1 and T2 are recorded (stored) in a storage element of the microcomputer.

Figure 20:
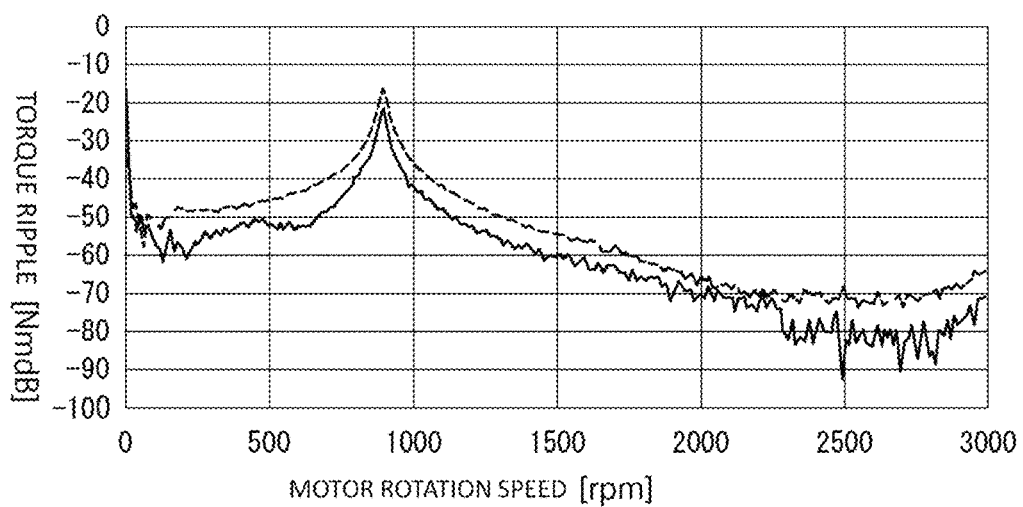
FIG. 20 is a graph showing the effect of compensation of torque ripple.
Figure 21:
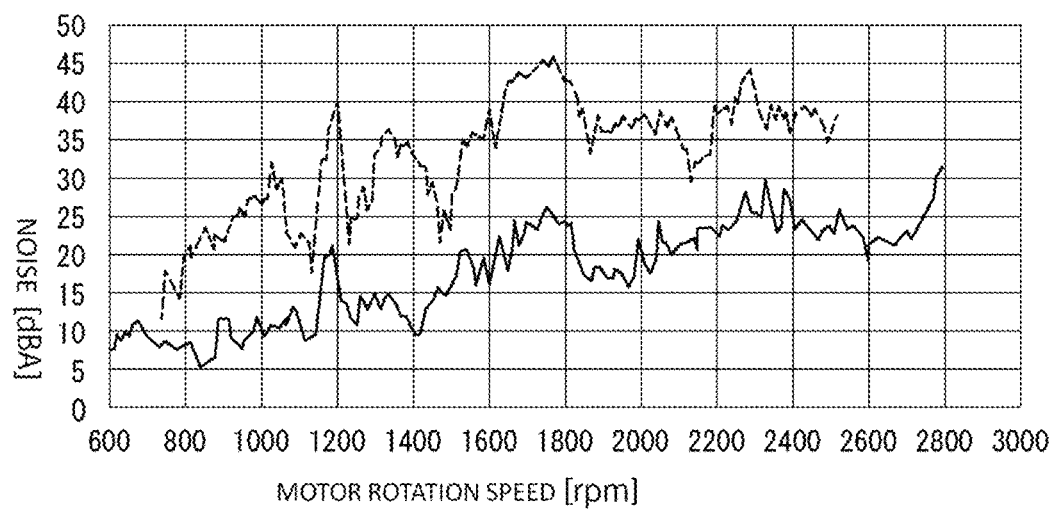
FIG. 21 is a graph showing the effect of compensation of noise.

The lookup tables T1 and T2 recorded (stored) in this way are used in the sound vibration compensation calculation unit 538 to calculate the compensation value $\gamma$ by the above expression (4), thereby achieving reduction of noise generated in the coupled system in which the motor and other elements are coupled. As described above, as the lookup tables T1 and T2, multiple types of lookup tables having different orders B may be stored. The compensation value $\gamma$ in such a case may be a compensation value obtained by adding the compensation values calculated from the reference values of the lookup tables as described above, for example. Alternatively, the compensation value $\gamma$ may be the compensation value $\gamma$ calculated by using the lookup tables T1 and T2 of the specific order B with the order B identified by the method described in step S102 of FIG. 16, for example. The noise data used to identify the order B is noise data measured in the vehicle interior in which a steering is being driven, for example. FIGS. 20 and 21 are graphs showing the effect of compensation by the compensation value $\gamma$.

The horizontal axis of each of FIGS. 20 and 21 represents the rotation speed of the motor, the vertical axis of FIG. 20 represents the torque ripple, and the vertical axis of FIG. 21 represents the noise. Additionally, in FIGS. 20 and 21, the state without compensation is indicated by a dotted line, and the state with compensation is indicated by a solid line.

As shown in FIG. 20, the torque ripple is reduced over the entire motor rotation speed as a result of compensation by the compensation value $\gamma$. Note, however, that the peak around about 900 rpm does not decrease much. On the other hand, noise is significantly reduced over the entire motor rotation speed as shown in FIG. 21. Accordingly, it can be seen that the compensation by the compensation value $\gamma$ is particularly effective for noise reduction of the coupled system.

Figure 22:
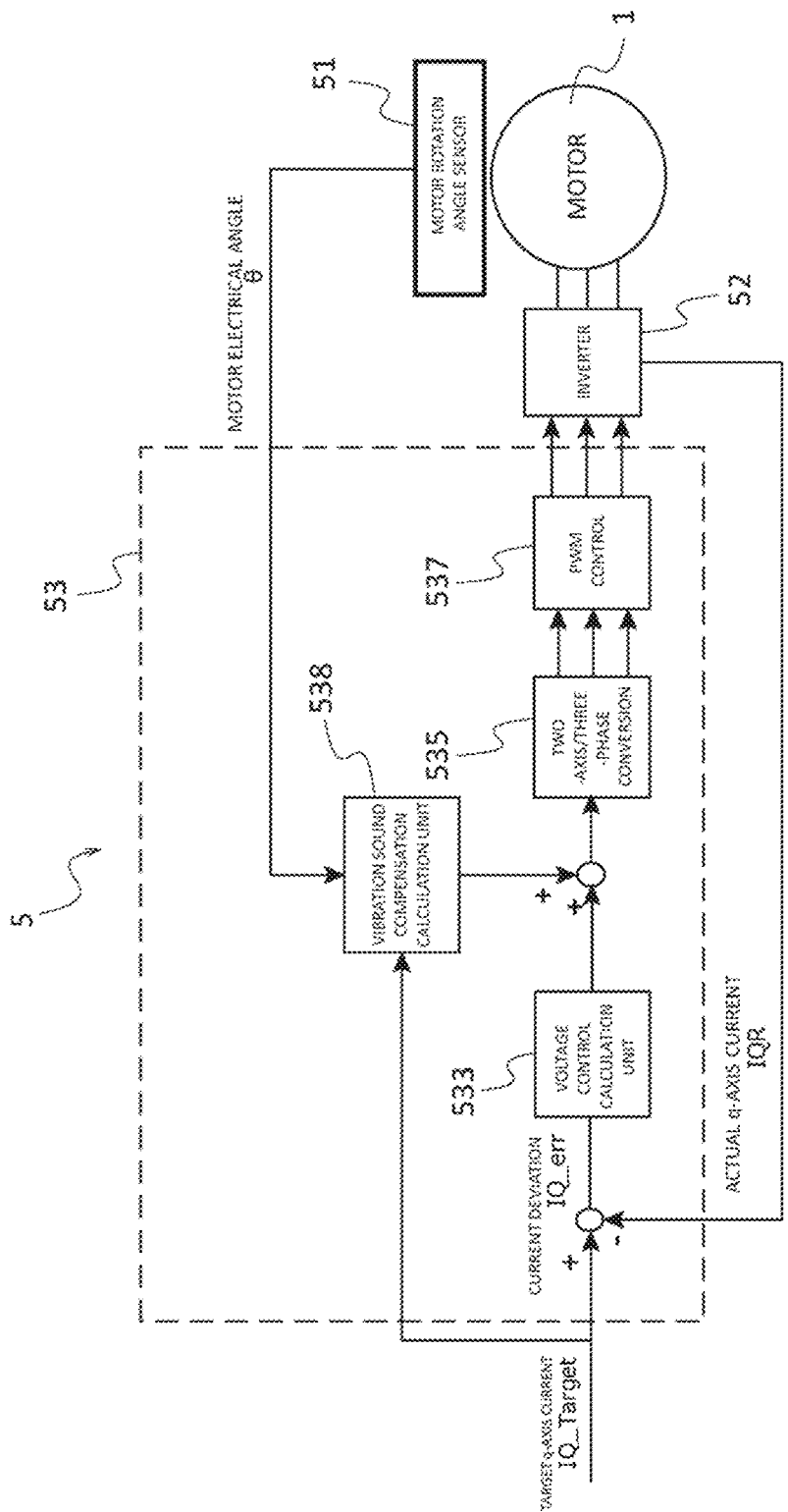
FIG. 22 is a schematic diagram of a motor control system of a fourth embodiment.
Figure 23:
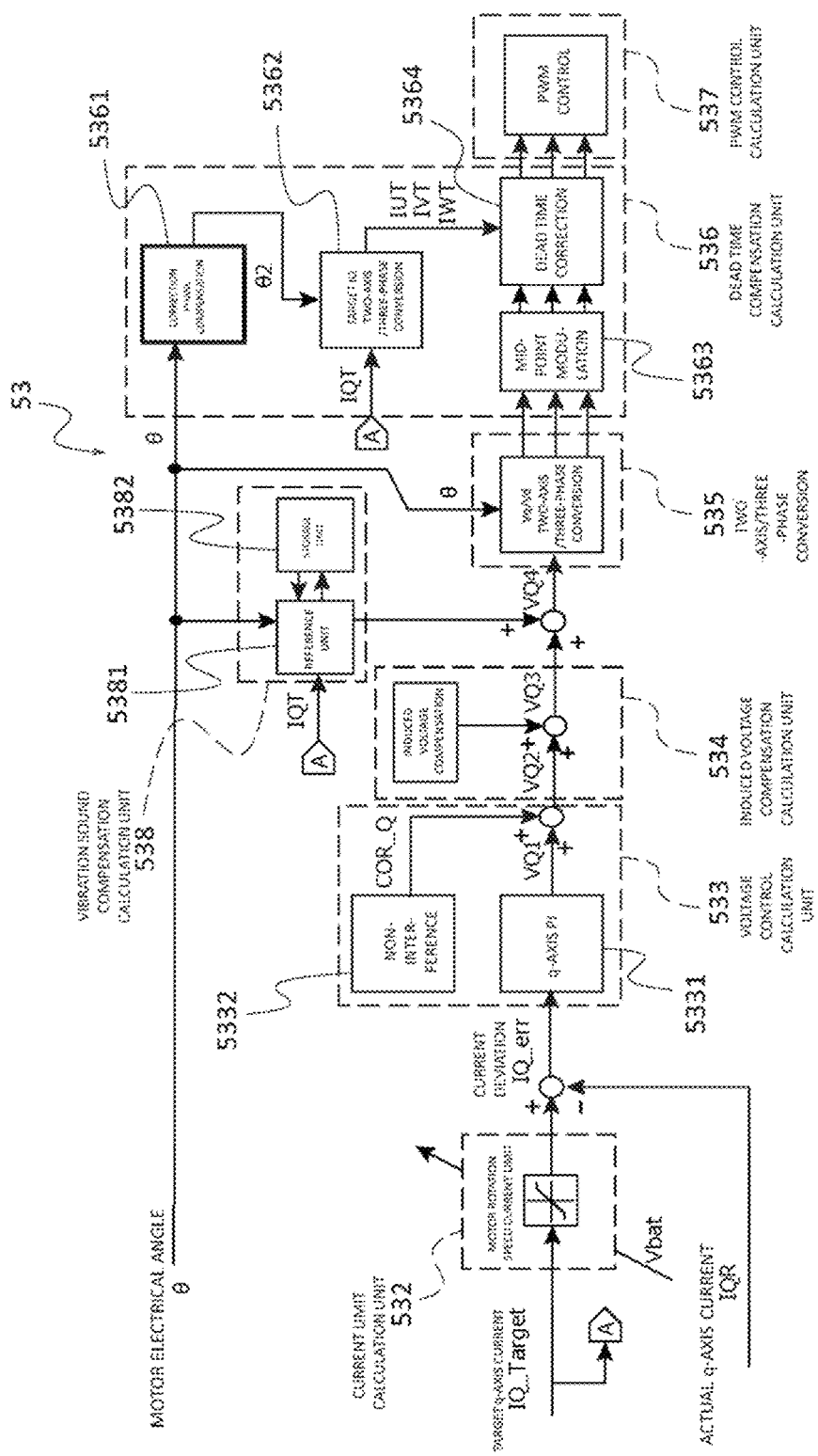
FIG. 23 is a schematic diagram of a control calculation unit of the fourth embodiment.

Such an effect is considered to be a result of executing advance angle control by the phase C under a control condition suitable for noise reduction rather than a control condition suitable for reduction of the torque ripple of the motor. In other words, compensation with the compensation value $\gamma$ cancels resonance or the like of the coupled system using the torque ripple of the motor. FIG. 22 is a schematic diagram of a motor control system of a fourth embodiment, and FIG. 23 is a schematic diagram of a control calculation unit of the fourth embodiment. A motor control system 5 of the fourth embodiment includes a sound vibration compensation calculation unit 538 instead of the torque ripple compensation calculation unit 531 of the second embodiment.

As shown in FIG. 23, the sound vibration compensation calculation unit 538 includes a storage unit 5382 that stores a lookup table, and a reference unit 5381 that obtains a compensation value by referring to the lookup table. The sound vibration compensation calculation unit 538 obtains a gain A and a phase C using a target q-axis current value Iq_target and a motor rotation speed co, and calculates a compensation value γ=A sin(Bθ+C). Note, however, that the compensation value γ calculated by the sound vibration compensation calculation unit 538 of the fourth embodiment is a compensation value added to a q-axis voltage command value VQ4.

The lookup table stored in the storage unit 5382 of the fourth embodiment is also created and recorded by a procedure similar to the procedure shown in the flowchart of FIG. 16. Then, the sound vibration (noise) generated by the coupled system in which the motor 1 and the other elements are coupled is reduced by compensation with the compensation value γ as in the third embodiment.

As an example of a coupled system, the coupled system in which the motor 1 and elements of the steering mechanism are coupled is shown above. However, the motor unit including a traction motor shown in FIGS. 11 and 12 or the like may also be a target of noise compensation by the compensation value γ, for example.

While embodiments of the present invention and modifications thereof have been described above, it will be understood that features, a combination of the features, and so on according to each of the embodiments and the modifications thereof are only illustrative and not restrictive, and that an addition, elimination, and substitution of a feature(s), and other modifications can be made without departing from the scope and spirit of the present invention. Also note that the present invention is not limited by the embodiments.

The embodiments of the present disclosure can be widely used for various devices including various motors such as a vacuum cleaner, a dryer, a ceiling fan, a washing machine, a refrigerator, and a power steering device.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A noise compensation adjustment method comprising:
   a measurement step of driving a motor to measure noise with respect to a coupled system including the motor and a driving body coupled to the motor and driven by the motor;
   an order identification step of, based on noise measured in the measurement step, identifying an order B of a component contributing to compensation of the noise from a k-th component and a 1/k-th component (k is an integer) in a rotation of the motor;
   an adjustment step of controlling driving of the motor using a component of the order B identified in the order identification step as a compensation value, and adjusting a component value of the order B to reduce the noise; and
   a recording step of recording the component value of the order B adjusted in the adjustment step as a compensation value for reducing the noise.

2. The noise compensation adjustment method according to claim 1, wherein the coupled system is a coupled system in which a motor and at least a part of a steering mechanism are coupled.

3. The noise compensation adjustment method according to claim 1, wherein in the adjustment step, gain and phase are adjusted as component values of the order B.

4. The noise compensation adjustment method according to claim 1, wherein in the order identification step, with respect to the noise measured in the measurement step, the order components in the rotation of the motor are compared with each other, and the order B of the component with large noise is identified.

5. The noise compensation adjustment method according to claim 4, wherein in the order identification step, with respect to the noise measured in the measurement step, a band with large noise is focused on from among bands of a rotation speed of the motor, and the order B of a component with large noise is identified in the band.

6. The noise compensation adjustment method according to claim 1, wherein in the recording step, the component value of the order B is recorded as a table map.

7. The noise compensation adjustment method according to claim 1, wherein the order B is a common multiple of the number of poles and the number of slots of the motor.

8. A manufacturing method of manufacturing a motor control system for controlling driving of a motor, the method comprising recording a component value of the order B in a storage unit in the motor control system by the noise compensation adjustment method according to claim 1.

9. The manufacturing method of a motor control system according to claim 8, further comprising recording the component value as a table map in the storage unit in the motor control system.

10. The manufacturing method of a motor control system according to claim 9, wherein the storage unit is a storage element in a microcomputer.

11. A motor control system for driving a motor having a phase number n of three or more, comprising:
    an inverter that drives the motor; and
    a control calculation unit that calculates a current command value indicating a current to be supplied to the motor from the inverter on a basis of a target current command value given from outside as a control target of the motor, wherein
    the control calculation unit includes
      a compensation calculation unit that compensates at least one of a k-th component and a 1/k-th component (k is an integer) in a rotation of the motor, and
      the compensation calculation unit compensates a signal value flowing to the inverter by using an order B of a component contributing to compensation of recorded noise.

12. The motor control system according to claim 11, wherein the compensation calculation unit compensates noise generated by coupling of the motor and at least a part of a steering mechanism.

13. The motor control system according to claim 11, wherein gain and phase are compensated as component values of the order B.

14. The motor control system according to claim 11, wherein with respect to noise during driving, the compensation calculation unit compares the order components in the rotation of the motor, and identifies and compensates the order B of the component with large noise.

15. The motor control system according to claim 14, wherein with respect to noise during driving, the compensation calculation unit focuses on to a band with large noise from among bands of a rotation speed of the motor, and compensates the order B of the component with large noise in the band.

16. The motor control system according to claim 11, wherein the compensation calculation unit compensates a component value of the order B as a table map.

17. The motor control system according to claim 11, wherein the order B is a common multiple of the number of poles and the number of slots of the motor.

18. A driving device comprising:
a motor control system according to claim 11; and
a motor whose driving is controlled by the motor control system.

19. A power steering device comprising:
a motor control system according to claim 11;
a motor whose driving is controlled by the motor control system; and
a power steering mechanism driven by the motor.

* * * * *